United States Patent
Hirukawa et al.

(10) Patent No.: US 8,405,816 B2
(45) Date of Patent: Mar. 26, 2013

(54) PATTERN FORMATION METHOD, PATTERN FORMATION APPARATUS, EXPOSURE METHOD, EXPOSURE APPARATUS, AND DEVICE MANUFACTURING METHOD

(75) Inventors: Shigeru Hirukawa, Tokyo (JP); Soichi Owa, Kumagaya (JP)

(73) Assignee: Nikon Corporation, Tokyo (JP)

( * ) Notice: Subject to any disclaimer, the term of this patent is extended or adjusted under 35 U.S.C. 154(b) by 924 days.

(21) Appl. No.: 12/330,870

(22) Filed: Dec. 9, 2008

(65) Prior Publication Data

US 2009/0135399 A1    May 28, 2009

Related U.S. Application Data

(63) Continuation of application No. PCT/JP2007/061709, filed on Jun. 11, 2007.

(30) Foreign Application Priority Data

Jun. 9, 2006   (JP) .................................. 2006-160886

(51) Int. Cl.
    *G03B 27/42*    (2006.01)
(52) U.S. Cl. ................ 355/53; 355/55; 355/63; 355/67; 355/77
(58) Field of Classification Search .................. 355/53, 355/55, 67; 430/5, 22, 30, 322, 325, 394; 359/618, 237, 872, 290, 291; 356/138, 614
    See application file for complete search history.

(56) References Cited

U.S. PATENT DOCUMENTS

| | | | |
|---|---|---|---|
| 7,106,490 B2 | 9/2006 | Sandstrom | |
| 7,136,087 B2 | 11/2006 | Okuyama et al. | |
| 7,158,280 B2 | 1/2007 | Sandstrom | |
| 7,180,575 B2 | 2/2007 | Ksaumi et al. | |
| 2002/0176062 A1* | 11/2002 | Cooper et al. | 355/53 |
| 2003/0011860 A1 | 1/2003 | Okuyama et al. | |
| 2003/0233630 A1 | 12/2003 | Sandstrom | |
| 2004/0053143 A1 | 3/2004 | Sandstrom | |
| 2005/0084766 A1 | 4/2005 | Sandstrom | |
| 2006/0077506 A1 | 4/2006 | Sandstrom | |
| 2006/0087635 A1 | 4/2006 | Kazumi et al. | |
| 2006/0209314 A1* | 9/2006 | Latypov et al. | 358/1.1 |

FOREIGN PATENT DOCUMENTS

| | | |
|---|---|---|
| JP | 2003-084444 | 3/2003 |
| JP | 2005-513770 | 5/2005 |
| JP | 2006-128194 | 5/2006 |
| WO | WO 03/052516 | 6/2003 |

OTHER PUBLICATIONS

International Search Report mailed Jul. 3, 2007 for International Application No. PCT/JP2007/061709.
Japanese Office Action for corresponding Japanese Application 2008-520645; dated Mar. 1, 2012.

(Continued)

*Primary Examiner* — Hung Henry Nguyen
*Assistant Examiner* — Mesfin T Asfaw

(57) ABSTRACT

A drive system determines a combination of basic patterns (type of basic patterns to be generated and the number of pulses of each basic pattern) based on design data of patterns and pattern combination information stored in a memory. Then, based on the determined result, each micro mirror of a variable molding mask is individually controlled such that a plurality of basic patterns are sequentially generated according to each of the number of pulses, and each basic pattern generated by the variable molding mask is sequentially image-formed on a plate via a projection optical system. Thus, a pattern with a desired line width corresponding to the design data is formed at a desired position on the object with a good accuracy.

45 Claims, 16 Drawing Sheets

OTHER PUBLICATIONS

Amendment for corresponding Japanese Application 2005-513770; dated Jan. 12, 2004.
Extended European Search Report dated Oct. 25, 2011 for corresponding European Patent Application No. 07 81 5072.
Written Opinion of the International Searching Authority (PCT/ISA/237) for International Application No. PCT/JP2007/061709).
Japanese Decision of Refusal mailed Jun. 28, 2012 in corresponding Japanese Patent Application No. 2008-520645.

* cited by examiner

Fig. 6

| pp | 90CE | 90LE | 90RI | 120LE | 120RI | 150CE |
|---|---|---|---|---|---|---|
| 180 | 34 | 8 | 8 | 0 | 0 | 0 |
| 200 | 0 | 0 | 8 | 13 | 29 | 0 |
| 210 | 44 | 0 | 0 | 3 | 3 | 0 |
| 240 | 32 | 1 | 1 | 8 | 8 | 0 |
| 300 | 21 | 0 | 0 | 11 | 11 | 7 |
| 450 | 20 | 0 | 0 | 4 | 4 | 22 |
| 600 | 2 | 2 | 2 | 16 | 16 | 12 |
| iso | 27 | 0 | 0 | 0 | 0 | 23 |

Fig. 7

| | $m_{1,j}$ | $m_{2,j}$ | $m_{3,j}$ | $m_{4,j}$ | $m_{5,j}$ | $m_{6,j}$ | $m_{7,j}$ | $m_{8,j}$ | $m_{9,j}$ | $m_{10,j}$ | $m_{11,j}$ | $m_{12,j}$ | $m_{13,j}$ | $m_{14,j}$ | $m_{15,j}$ | $m_{16,j}$ | $m_{17,j}$ | $m_{18,j}$ | $m_{19,j}$ | $m_{20,j}$ | $m_{21,j}$ | $m_{22,j}$ | $m_{23,j}$ |
|---|---|---|---|---|---|---|---|---|---|---|---|---|---|---|---|---|---|---|---|---|---|---|---|
| 90GE | 0 | 0 | 0 | 1 | 1 | 1 | 1 | 0 | 0 | 0 | 1 | 1 | 1 | 1 | 0 | 0 | 0 | 1 | 1 | 1 | 1 | 1 | 0 |
| 90LE | 0 | 0 | 1 | 1 | 1 | 1 | 0 | 0 | 0 | 1 | 1 | 1 | 1 | 0 | 0 | 1 | 0 | 1 | 1 | 1 | 1 | 0 | 0 |
| 90RI | 1 | 0 | 0 | 0 | 1 | 1 | 1 | 1 | 0 | 0 | 0 | 1 | 1 | 1 | 1 | 0 | 0 | 0 | 1 | 1 | 0 | 1 | 1 |
| 120LE | 0 | 0 | 0 | 1 | 1 | 1 | 0 | 0 | 0 | 0 | 1 | 1 | 1 | 0 | 0 | 0 | 0 | 1 | 1 | 1 | 1 | 0 | 0 |
| 120RI | 0 | 0 | 0 | 0 | 1 | 1 | 1 | 0 | 0 | 0 | 0 | 1 | 1 | 1 | 0 | 0 | 0 | 0 | 1 | 1 | 0 | 1 | 0 |
| 150GE | 0 | 0 | 0 | 0 | 1 | 1 | 0 | 0 | 0 | 0 | 0 | 1 | 1 | 0 | 0 | 0 | 0 | 0 | 1 | 1 | 0 | 0 | 0 |

Fig. 8

| pp | Δ-CD | Δ-Pos |
|---|---|---|
| 180 | 0.145 | 0.000 |
| 200 | −0.109 | 0.000 |
| 210 | 0.196 | 0.000 |
| 240 | 0.061 | 0.000 |
| 300 | −0.074 | 0.000 |
| 450 | 0.180 | 0.000 |
| 600 | −0.104 | 0.000 |
| iso | 0.000 | 0.000 |

Fig. 10

| pp | 90CE | 90LE | 90RI | 120LE | 120RI | 150CE |
|---|---|---|---|---|---|---|
| 180 | 29 | 19 | 2 | 0 | 0 | 0 |
| 200 | 0 | 0 | 8 | 13 | 29 | 0 |
| 210 | 27 | 0 | 13 | 0 | 10 | 0 |
| 240 | 27 | 0 | 13 | 0 | 10 | 0 |
| 300 | 16 | 0 | 1 | 0 | 33 | 0 |
| 450 | 8 | 0 | 1 | 0 | 31 | 11 |
| 600 | 8 | 0 | 6 | 0 | 18 | 18 |

Fig. 11

| pp | Δ-CD | Δ-Pos |
|---|---|---|
| 180 | 0.047 | −0.221 |
| 200 | 0.014 | 0.006 |
| 210 | 0.022 | −0.366 |
| 240 | 0.022 | −0.366 |
| 300 | −0.060 | 0.205 |
| 450 | −0.004 | −0.184 |
| 600 | 0.071 | −0.120 |

US 8,405,816 B2

PATTERN FORMATION METHOD, PATTERN FORMATION APPARATUS, EXPOSURE METHOD, EXPOSURE APPARATUS, AND DEVICE MANUFACTURING METHOD

CROSS-REFERENCE TO RELATED APPLICATIONS

This application is a continuation of International Application PCT/JP2007/061709, with an international filing date of Jun. 11, 2007, the disclosure of which is hereby incorporated herein by reference in its entirety, which was not published in English.

BACKGROUND OF THE INVENTION

1. Field of the Invention

The present invention relates to a pattern formation method, a pattern formation apparatus, an exposure method, an exposure apparatus, and a device manufacturing method, more specifically to a pattern formation method and a pattern formation apparatus used to form patterns on an object, an exposure method and an exposure apparatus used to expose an object with an illumination light, and a device manufacturing method with the pattern formation method, the exposure method, or the exposure apparatus.

2. Description of the Background Art

Conventionally, in a lithography process for manufacturing electronic devices (micro devices) such as a semiconductor device and a liquid-crystal display element, a projection exposure apparatus (stepper) with a step-and-repeat method, a projection exposure apparatus (scanner) with a step-and-scan method, or the like which transfers a pattern formed on a mask (reticle, photomask, or the like) onto a plate (glass plate, wafer, or the like) coated with a photosensitive agent such as a resist via a projection optical system has been used.

Meanwhile, recently, a maskless-type exposure apparatus that is capable of forming devices without expensive masks, i.e., an exposure apparatus that uses a variable molding mask (called also an active mask or an image generator) with a plurality of modulation elements, which spatially individually modulate at least one of amplitude, phases and polarization of illumination lights without masks as an original plate with a fixed pattern, has been proposed (see, e.g., Kokai (Japanese Unexamined Patent Application Publication) No. 2004-327660). According to a maskless-type exposure apparatus described in Kokai (Japanese Unexamined Patent Application Publication) No. 2004-327660), by changing patterns generated on a variable pattern generation device (variable molding mask) in synchronous with scanning of a substrate stage, a desired pattern can be formed on a substrate held on the substrate stage. Moreover, since the apparatus does not need to be equipped with a mask stage unlike an exposure apparatus with a conventional mask, cost reduction and miniaturization of exposure apparatuses are made possible.

However, for the maskless-type exposure apparatus described above, it has been recently cleared to be difficult to obtain, particularly, a pattern with a size (i.e. line width) which is not equal to any of integer multiples of a size corresponding to that of the modulation elements at a desired position, since sizes and positions of modulation elements (e.g., mirrors, or the like) are fixed on the variable pattern generation device, not only for a transmissive type but also for a reflective type.

SUMMARY OF THE INVENTION

The inventors performed various simulations supposing to use a DMD (digital micro mirror device), e.g. with mirror elements (micro mirrors) as modulation elements, as a variable molding mask to find out that by varying a pattern generated by a variable molding mask during a formation of an identical pattern, even a pattern with a line width that is not any of integer multiples of a size corresponding to that of the mirror element can be formed on a substrate (sensitive substrate) coated with a sensitive agent (a resist) on its surface. The present invention is created based on the new findings by the inventors.

According to a first aspect of the present invention, there is provided a pattern formation method in which a pattern is formed on an object by using a variable molding mask that has a plurality of modulation elements, which are two-dimensionally placed at an incident position of an illumination light, and spatially individually modulate at least one of amplitude, phase, and polarization states of the illumination light, and generates a pattern made up of light areas and dark areas, the method comprising: an acquiring process in which information on a target pattern is acquired; and a pattern forming process in which a plurality of modulation elements of the variable molding mask are controlled such that at least one of the number and positions of a plurality of the modulation elements on the variable molding mask, which contribute to image-forming of a pattern by irradiating the illumination light, is changed while the target pattern is formed on the object, based on information on the target pattern.

With this method, while information on a target pattern is acquired, and a plurality of modulation elements of a variable molding mask are controlled such that at least one of the number and positions of a plurality of modulation elements on the variable molding mask, which contributes to image-forming of patterns by irradiating an illumination light, is changed while the target pattern is formed on an object based on the information on the target pattern. Thus, plural types of combinations of a plurality of modulation elements in which at least one of the number and positions on the variable molding mask is different, which contribute to image-forming of patterns by irradiating an illumination light, occur, and images of patterns corresponding to the combinations of each modulation element are formed on the object in an overlaid manner. Therefore, by determining a way to combine a plurality of modulation elements, which contributes to image-forming of patterns by irradiating an illumination light, and a way to combine the combinations based, e.g., on experiments, simulations, or the like, it becomes possible to form a pattern with a desired line width at a desired position on the object with a good accuracy.

According to a second aspect of the present invention, there is provided a first device manufacturing method, comprising: a process in which a pattern is formed on an object by using the pattern formation method of the present invention; and a process in which the object on which the pattern was formed is developed.

According to a third aspect of the present invention, there is provided an exposure method in which an object is exposed with an illumination light via a variable molding mask on which a plurality of modulation elements are placed two-dimensionally, the method comprising; changing at least one of the number and positions of modulation elements on the variable molding mask which contribute to generation of the pattern, during the exposure to form a pattern with a size of non-integer multiples of the modulation element at least partially on the object.

With this method, to form patterns with a size of a non-integer multiple of the modulation element at least partially on the object, at least one of the number and positions of modulation elements on the variable molding mask, which contributes to generation of patterns, is changed during exposure, so that an illumination light corresponding to the number and positions of modulation elements exposes the object in an overlaid manner. Therefore, it becomes possible to form a pattern with a desired line width at a desired position on the object with a good accuracy.

According to a fourth aspect of the present invention, there is provided a second device manufacturing method, comprising; exposing an object by using the exposure method of the present invention; and developing the object exposed.

According to a fifth aspect of the present invention, there is provided a pattern formation apparatus that forms a pattern on an object, the apparatus comprising: an illumination system that emits an illumination light; a variable molding mask with a plurality of modulation elements that are two-dimensionally placed at an incident position of the illumination light and spatially individually modulate at least one of amplitude, phase, and polarization states of the illumination light, and generates a pattern made up of light areas and dark areas; an optical system that projects a pattern generated by the variable molding mask onto the object; and a controller that controls a plurality of modulation elements of the variable molding mask such that at least one of the number and positions of a plurality of the modulation elements on the variable molding mask, which contribute to image-forming of the pattern by irradiating the illumination light, is changed while the target pattern is formed on the object, based on information on the target pattern.

With this apparatus, the controller controls a plurality of modulation elements of the variable molding mask such that at least one of the number and positions of a plurality of modulation elements on the variable molding mask, which contributes to image-forming of patterns by irradiating an illumination light from an illumination system, is changed while the target pattern is formed on the object, based on information on the target pattern. Thus, plural types of combinations of a plurality of modulation elements in which at least one of the number and positions on the variable molding mask is different, which contribute to image-forming of patterns by irradiating an illumination light, occur, and the images of patterns corresponding to the combinations of each modulation element are formed on the object in an overlaid manner. Therefore, by determining a way to combine a plurality of modulation elements, which contributes to image-forming of patterns by irradiating an illumination light, and a way to combine the combinations based, e.g., on experiments, simulations, or the like, it becomes possible to form a pattern with a desired line width at a desired position on the object with a good accuracy.

According to a sixth aspect of the present invention, there is provided a first exposure apparatus that exposes an object with an energy beam to form a predetermined pattern on the object, the apparatus comprising: the pattern formation apparatus of the present invention as a formation device of the pattern.

According to a seventh aspect of the present invention, there is provided a second exposure apparatus that exposes an object with an illumination light, the apparatus comprising: a variable molding mask on which a plurality of modulation elements are placed two-dimensionally; and a controller that changes at least one of the number and positions of modulation elements on the variable molding mask, which contribute to generation of patterns, during the exposure, to form a pattern with a size of a non-integer multiple of the modulation elements on the object at least partially.

With this apparatus, the controller, to form a pattern with a size of a non-integer multiple of the modulation element on the object, changes at least one of the number and positions of modulation elements on the variable molding mask, which contributes to generation of patterns at least partially during exposure. For this reason, an illumination light according to the number and positions of modulation elements exposes the object in an overlaid manner, and consequently, it becomes possible to form a pattern with a desired line width at a desired position on the object with a good accuracy.

According to an eighth aspect of the present invention, there is provided a third device manufacturing method, comprising; a process in which an object is exposed by using the exposure apparatus of the present invention and a predetermined pattern is formed on the object; and a process in which the object on which the pattern was formed is developed.

BRIEF DESCRIPTION OF THE DRAWINGS

In the accompanying drawings;

FIG. 6 is a view for explaining an example of overlay information suitable for the line-and-space pattern shown in FIG. 5;

FIG. 7 is a view for explaining an example of a basic pattern;

FIG. 8 is a view for explaining a line-width error ($\Delta$-CD) and a positional error ($\Delta$-Pos) of a pattern formed by using the overlay information shown in FIG. 6;

FIG. 10 is a view for explaining an example of overlay information suitable for the line-and-space pattern shown in FIG. 9;

FIG. 11 is a view for explaining a line-width error ($\Delta$-CD) and a positional error ($\Delta$-Pos) of a pattern formed by using the overlay information shown in FIG. 10;

DESCRIPTION OF THE EMBODIMENTS

First Embodiment

Figure 1:
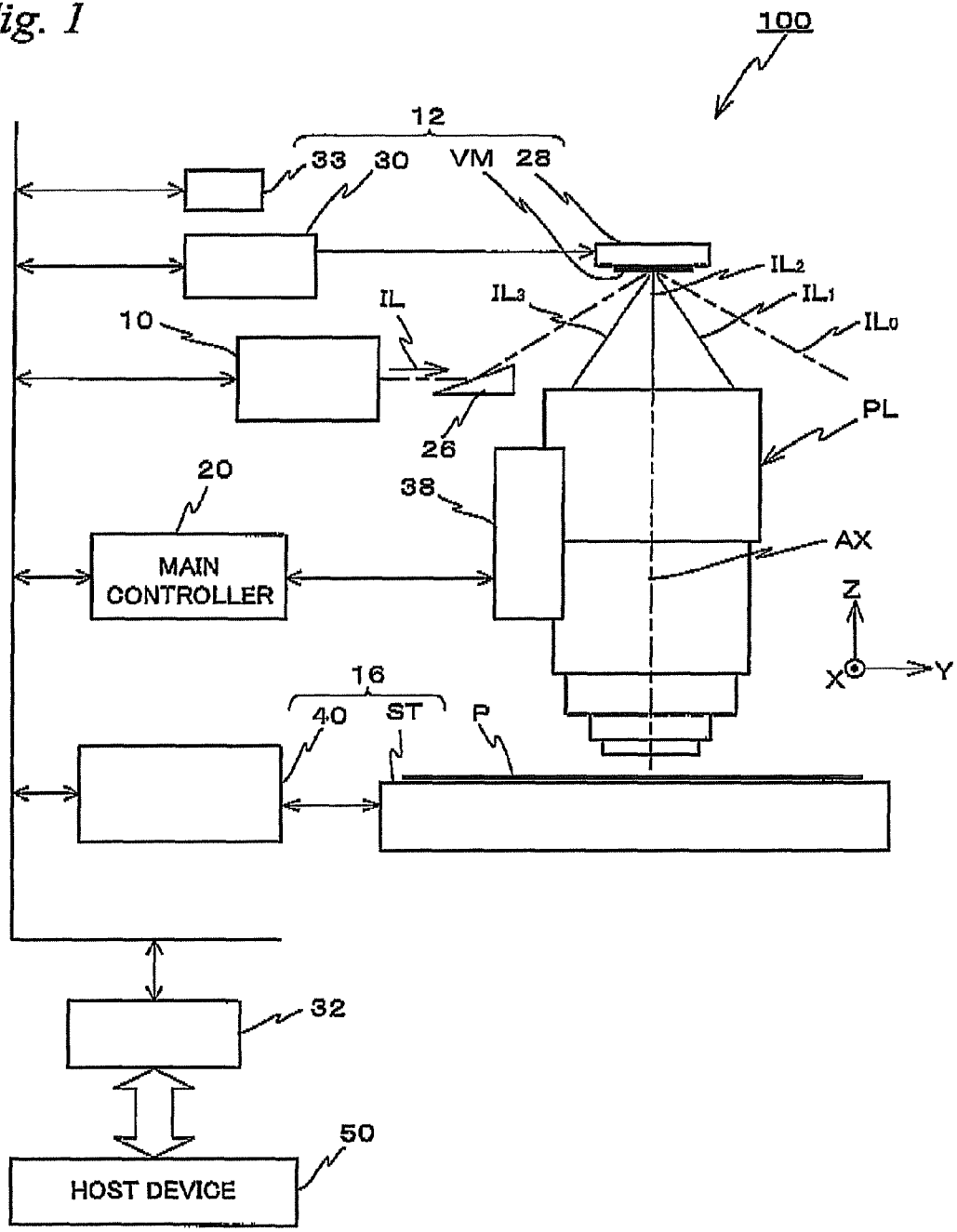
FIG. 1 is a view schematically showing a constitution of an exposure apparatus according to the first embodiment.

Hereinafter, descriptions are made for the first embodiment of the present invention based on FIG. 1 to FIG. 11. FIG. 1 schematically shows a constitution of an exposure apparatus 100 according to the first embodiment.

The exposure apparatus 100 is equipped with an illumination system 10, a pattern generation device 12, a projection optical system PL, a stage device 16, a control system that controls these devices and systems, and the like. The exposure apparatus 100 performs an exposure process by projecting an image of a pattern, which is generated by the pattern generation device 12, on a plate (sensitive substrate) P mounted on a stage ST that constitutes a part of the stage device 16, via a projection optical system PL. Further, the exposure apparatus 100 is a scanning exposure apparatus that forms patterns on the plate P by synchronizing switching (changing) of a pattern generated by the pattern generation device 12 with movement of the plate P. In following descriptions, it is supposed that a direction parallel to the optical axis AX of the projection optical system PL is the Z-axis direction, a direction in which the plate P is scanned relatively to the projection optical system PL on a plane orthogonal to the Z-axis is the Y-axis direction, and a direction orthogonal to the Z-axis and the Y-axis is the X-axis direction. Further, it is supposed that rotation (inclination) directions around the X-axis, the Y-axis, and the Z-axis are, respectively, the θx, θy, and θz directions.

The control system includes a microcomputer, and is composed mainly of a main controller 20 that controls the entire apparatus. The control system is connected to a host device 50, which is composed of a workstation or the like, via an interface 32. The interface 32 is a communication interface that controls communication with the host device 50.

The illumination system 10 performs uniform illumination of a variable molding mask VM (described later), which constitutes a part of the pattern generation device 12, with an illumination light (exposure light) IL, and is equipped with; a light source system including a light source and a light source control system; an illumination optical system including a collimating lens, an optical integrator, an illumination condition setting mechanism capable of changing light quantity distributions of illumination lights on the pupil plane of the illumination optical system, a field stop, a relay lens, a prism 26, and so on; and the like (not shown).

Here, as the light source, as disclosed, e.g., in International Publication No. 1999/46835 pamphlet (corresponding U.S. Pat. No. 7,023,610 specification) or the like, a harmonic generator that outputs an ultraviolet light (pulsed light), being an eighth-harmonic with a wavelength in a range from 193 to 194 nm, which is obtained from a single wavelength laser light with a wavelength of 1.544 to 1.553 μm oscillated from a single wavelength oscillation laser such as a DFB semiconductor laser or a fiber laser (e.g. the ytterbium-doped fiber laser), by amplifying the light with a fiber amplifier to which erbium (or both erbium (Er) and ytterbium (Yb)) is doped, and by converting its wavelength with a nonlinear optical crystal, is used.

The illumination condition setting mechanism includes, e.g., a shaping optical system that is placed on the incident side of the optical integrator in the illumination optical system, and has a plurality of optical elements including a replaceable diffractive optical element, a movable prism, a zooming optical system, a polarization member, and the like, e.g., and changes intensity distributions (shape and/or size of a secondary light source) of the illumination light IL on the pupil plane of the illumination optical system, i.e., illumination conditions of the variable molding mask VM by replacement, movement, or the like of at least one optical element. As the optical integrator, e.g., a fly-eye lens, a rod type integrator, a diffraction element, or the like can be used.

Although the prism 26 actually constitutes a part of the illumination optical system as described above, it has been shown by taking out from the illumination system 10 in FIG. 1 for convenience of explanation. Hereinafter, it is supposed that the prism 26 is outside the illumination system. The prism 26 reflects (polarizes) the illumination light IL from the illumination system 10 toward the variable molding mask VM.

The pattern generation device 12 is an electronic mask system that generates a variable pattern to be projected onto the plate P mounted on the stage ST, and is equipped with: the variable molding mask VM; a holder 28 that holds the variable molding mask VM; a drive system (controller) 30 that controls operation states of the variable molding mask VM; a memory 33 and the like.

The variable molding mask VM is placed above (+Z side) the projection optical system PL, and the illumination light IL deflected by the prism 26 is made incident to the mask. The variable molding mask VM includes, e.g., a DMD (Digital Micro-mirror Device, Deformable Micro-mirror Device), which is a type of a non-emissive image display element (called also a spatial light modulator (SLM)) and reflects/polarizes incident lights by units of mirror elements (micro mirrors) that are two-dimensionally arranged (placed) to spatially modulate intensities (amplitudes) of incident lights toward the projection optical system PL. On a surface of the variable molding mask VM, the micro mirrors (mirror elements), being a plurality of modulation elements, are arranged in a form of a two-dimensional matrix, and a driving mechanism (actuator) that varies an incident angle (and output angle) of incident lights toward the micro mirrors is arranged on each micro mirror. In the present embodiment, a cover glass (not shown) of the DMD is formed from synthetic silica, since the illumination light IL with a wavelength in a range from 193 to 194 nm is used.

The drive system 30 acquires design data (e.g. CAD data) of a pattern of data necessary in forming a pattern image from the host device 50 via the interface 32. Then, the drive system 30 refers to various information (hereinafter, called "signal generation information") stored in the memory 33, and generates signals to drive each micro mirror of the variable molding mask VM based on the design data acquired. The signals to drive each micro mirror are supplied to the driving mechanism of each micro mirror. Thus, each micro mirror performs a binary action between an ON state and an OFF state, and generates a desired reflection pattern in the entire variable molding mask VM. In other words, each micro mirror performs a binary action between an ON state in which a 1st-order diffracted light $IL_1$, a 2nd-order diffracted light $IL_2$, and a 3rd-order diffracted light $IL_3$ of the illumination light IL from the reflection pattern generated by the variable molding mask VM are guided in an incident direction to the projection optical system PL, and an OFF state in which the 1st-order diffracted light $IL_1$ is guided to a non-exposure optical path that is off from the projection optical system PL with a 0th-order diffracted light $IL_0$ of the illumination light IL, and generates a desired reflection pattern as a whole. In the present embodiment, even in the ON state of each micro mirror, as shown in FIG. 1, the 0th-order diffracted light $IL_0$ is guided to the non-exposure optical path off from the projection optical system PL. Further, in the ON state of each micro mirror, the 2nd-order diffracted light $IL_2$ is guided to a direction parallel with the optical axis AX of the projection optical system PL.

The drive system 30 can vary patterns to be generated by the variable molding mask VM based on the design data acquired. Thus, patterns generated by the variable molding mask VM can be appropriately varied synchronously with movement of the plate P mounted on the stage ST. Hereinafter, an attitude of a micro mirror in the ON state in which reflected lights are incident to the projection optical system PL is also called an "On attitude", and an attitude of a micro mirror in the OFF state in which reflected lights are guided to the non-exposure optical path is called also an "Off attitude". Note that details of works of the drive system 30 is described later.

The projection optical system PL has a plurality of optical elements (lens elements and the like) that are arranged along the optical axis AX parallel with the Z-axis direction inside a mirror barrel in a predetermined positional relation. The projection optical system PL is an image-side telecentric optical system, and performs a reduced projection of a pattern generated by the pattern generation device 12 (the variable molding mask VM) at a projection magnification $\beta$ ($\beta$ is, e.g., 1/400) onto the plate P placed on the exposure surface. Further, an image-forming property compensation device 38, which drives particular lens elements inside the projection optical system PL in the optical axis AX direction and tilt directions for the XY plane orthogonal to the optical axis AX, is arranged in the projection optical system PL. The image-forming property compensation device 38 adjusts image-forming states (image-forming properties of the projection optical system PL) of pattern images generated on the plate P via the projection optical system PL. However, instead of the method to drive optical elements of the projection optical system PL or in a combination with the method, another method, e.g., to adjust wavelength properties of the illumination light IL (center of wavelength, spectrum width, or the like) by controlling the light source system can be employed.

The stage device 16 is equipped with: the stage ST that is movable while holding a plate (e.g., glass substrate, semiconductor wafer, or the like) Pt being an object to be exposed; and a stage drive system 40 that controls operation states (movement or the like) of the stage ST according to a command from the main controller 20.

The stage ST is movable in the X-axis, Y-axis, and Z-axis directions and rotatable in the θx, θy, and θz directions, and is capable of aligning the plate P in the 6 degrees of freedom to an image of a pattern generated by the variable molding mask VM through the projection optical system PL. Moreover, to perform a scanning exposure of the plate P with the illumination light IL via the variable molding mask VM and the projection optical system PL, the stage ST is moved in a predetermined scanning direction within the XY plane (e.g., the Y-axis direction that is the horizontal direction within the page surface in FIG. 1) at a desired speed, and thus, the plate P is moved synchronously with a variation of the pattern (displayed image) generated by the variable molding mask VM.

Positional information (including rotation information) of the stage ST is measured by a positional measurement system (not shown) (including, e.g., laser interferometers and/or encoders and also including focus sensors or the like if necessary (all are not shown)), and supplied to the main controller 20. The main controller 20 drives motors or the like of the stage drive system 40 based on the positional information and performs movement and positioning of the plate P.

The main controller 20 controls the operation of the illumination system 10, the pattern generation device 12, the stage device 16, or the like, to form an image of patterns generated sequentially on the plate P via the projection optical system PL by the variable molding mask VM. At the formation, the main controller 20 performs a scanning exposure by moving the plate P at an appropriate speed while scrolling patterns generated by the variable molding mask VM synchronously with movement via the drive system 30.

Here, the display speed V2 in the scanning direction of patterns displayed by the variable molding mask VM is given to be V2=V1/$\beta$, where V1 is the scanning speed of the stage ST holding the plate P. Therefore, in the present embodiment where the projection magnification $\beta$ of the projection optical system PL is 1/400, the display speed V2 of the patterns generated by the variable molding mask VM in the scanning direction is 400 times the speed V1 of the stage ST.

The image-forming of an image of patterns on the plate P in the present embodiment utilizes interference among a plurality of diffracted lights with different orders, more specifically, as clear from FIG. 1, it utilizes interference among three optical fluxes of the 1st-order diffracted light $IL_1$, the 2nd-order diffracted light $IL_2$, and the 3rd-order diffracted light $IL_3$ of the illumination light IL irradiated on the variable molding mask VM from a pattern generated by the variable molding mask VM.

Next, descriptions are given for operations of the drive system 30. First, several prerequisite conditions are described prior to descriptions of specific operations.

Figure 2:
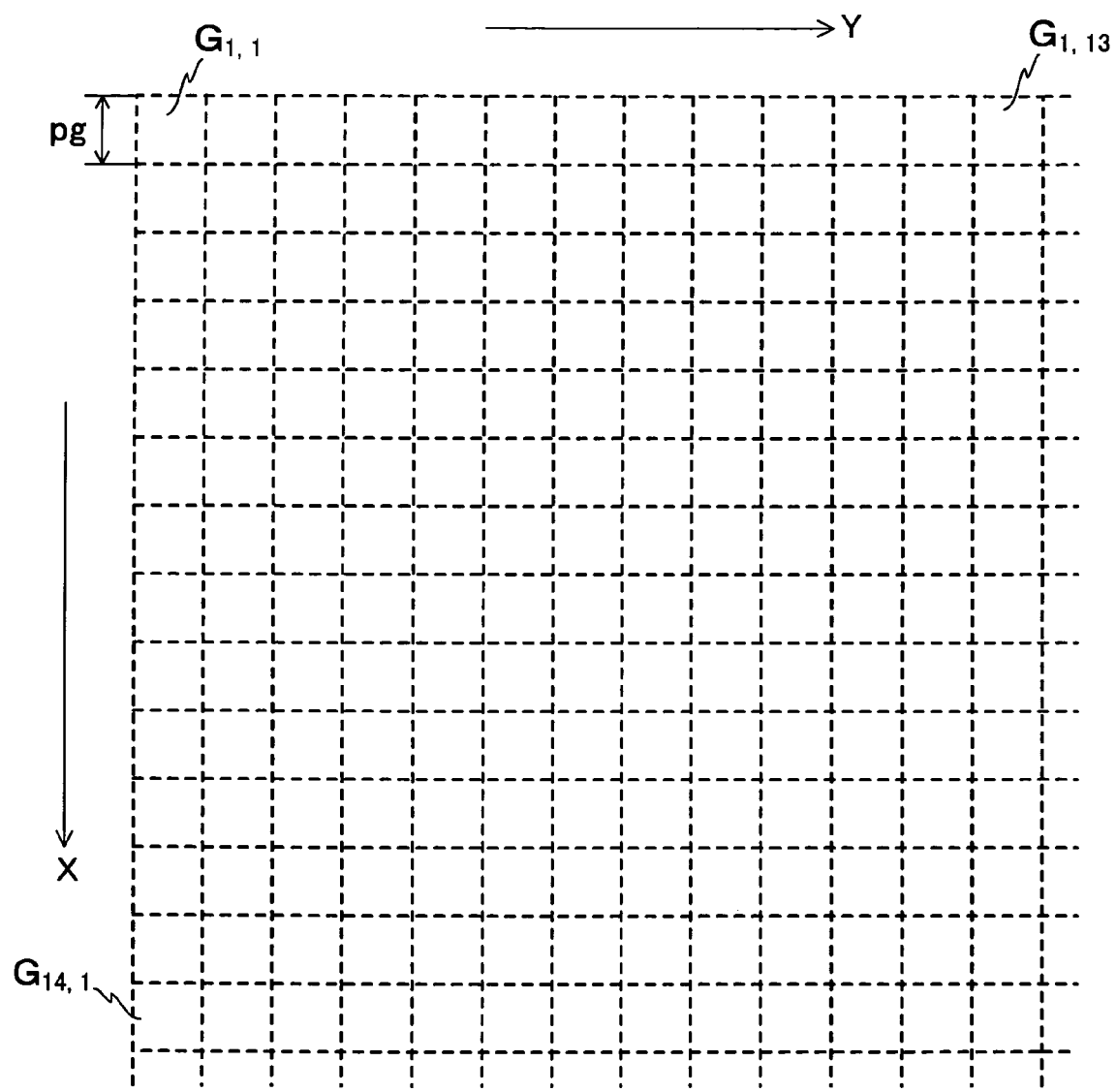
FIG. 2 is a view for explaining two-dimensional pixels virtually set on a plate.
Figure 3:
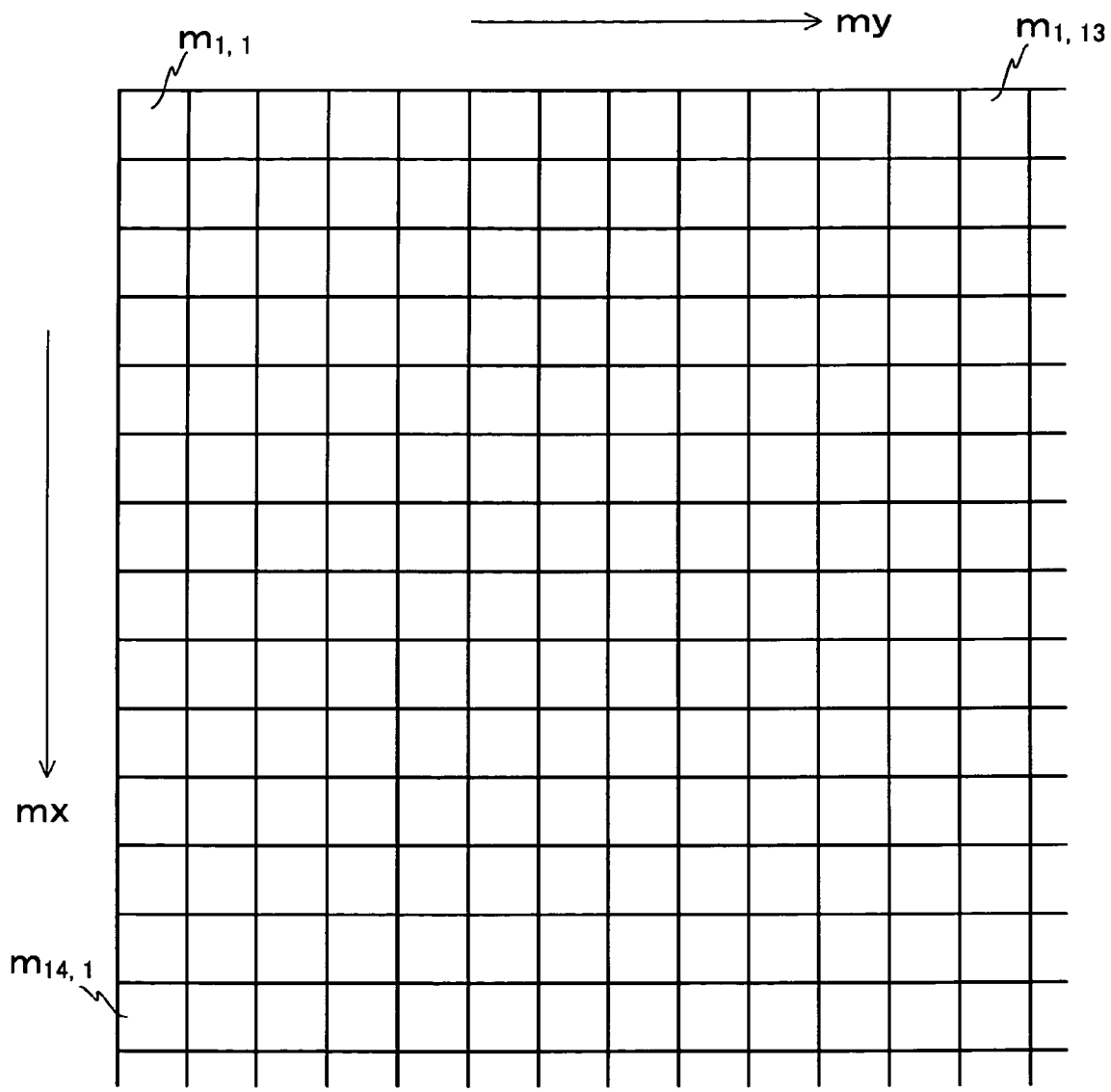
FIG. 3 is a view for explaining placement of micro mirrors according to the first embodiment.

Here, as shown in FIG. 2 as an example, it is supposed that the two-dimensional pixels composed of a plurality of pixels which are placed along the X-axis direction and the Y-axis direction in a shape of a matrix are virtually set on the plate P. Note that in FIG. 2, pg is a pixel size (pixel pitch) in the X-axis direction and the Y-axis direction Here, as an example, it is supposed that the number of pixels in the X-axis direction is nx, the number of pixels in the Y-axis direction is ny, and each pixel is indicated with $G_{i,j}$ (i=1 to nx and j=1 to ny). Note that the +X direction is the increasing direction of i and the +Y direction is the increasing direction of j.

Corresponding to the virtual two-dimensional pixel $G_{i,j}$ (i=1 to nx and j=1 to ny) described above, as shown in FIG. 3 as an example, a plurality of micro mirrors are two-dimensionally placed on the variable molding mask VM described above, which is placed at the incident position of the illumination light IL, along a direction (mx-direction) corresponding to the X-axis direction on the plate P and a direction (my-direction) corresponding to the Y-axis direction on the plate P. Here, it is supposed that the number of micro mirrors in the mx-direction is nx, the number of micro mirrors in the my-direction is ny, and each micro mirror is indicated with $m_{i,j}$ (i=1 to nx and j=1 to ny) For example, $m_{1,1}$ corresponds to $G_{1,1}$, $m_{1,13}$ corresponds to $G_{1,13}$, and $m_{14,1}$ corresponds to $G_{14,1}$. In other words, the +mx-direction is the increasing direction of i, and the +my-direction is the increasing direction of j. Although two-dimensional pixels are actually set virtually on the plate P corresponding to the micro mirrors on the variable molding mask VM, for convenience of explanation, it is supposed that the micro mirrors of the variable molding mask VM are placed corresponding to the virtual two-dimensional pixels.

Figure 4:
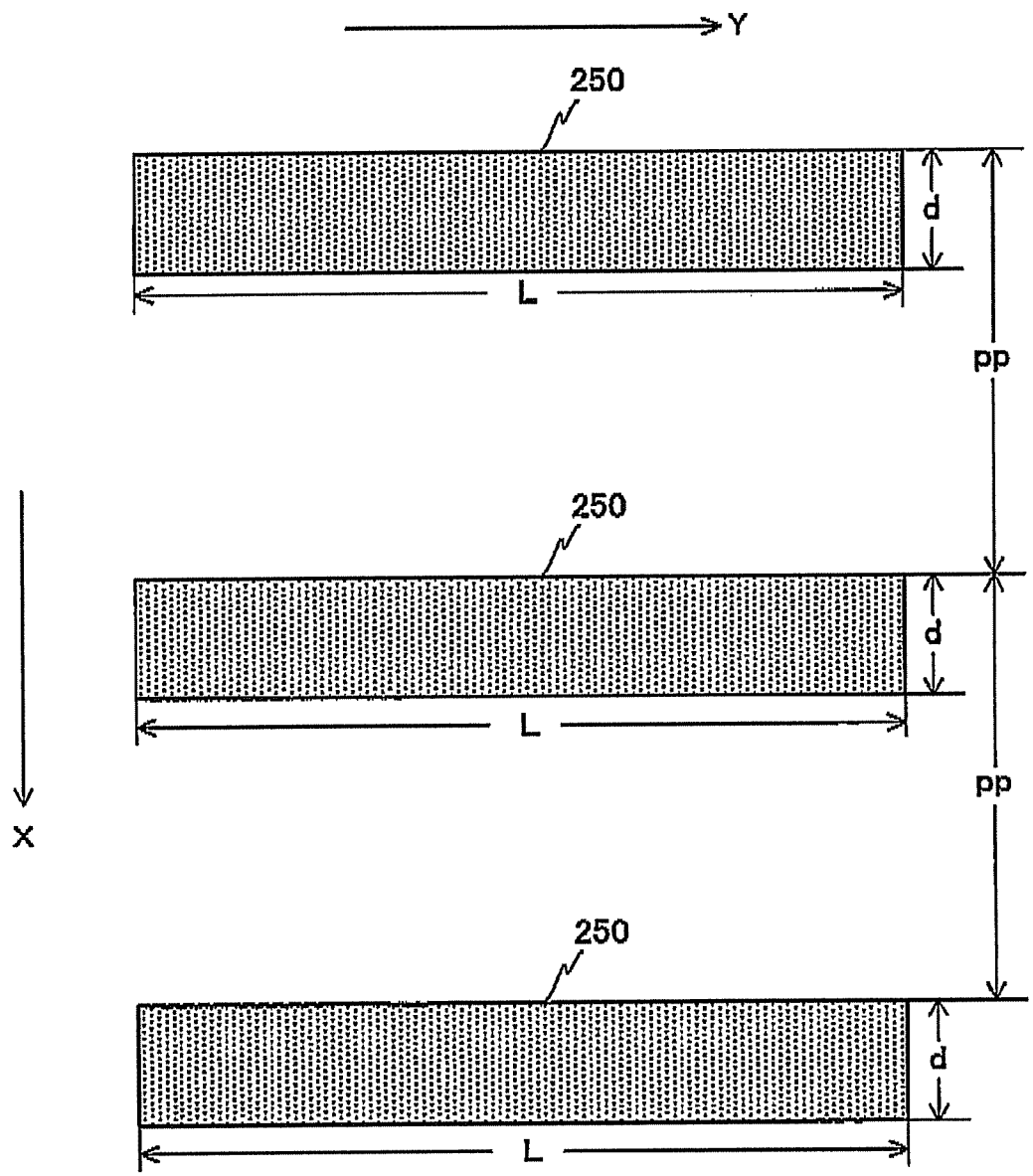
FIG. 4 is a view for explaining a line-and-space pattern.

Here, as shown in FIG. 4 as an example, it is supposed that a so-called line-and-space pattern (L/S pattern), where a plurality of line patterns 250 with a line width d and a length L are placed at a pitch pp along the X-axis direction, is used as a target pattern, and an image of the line-and-space pattern (hereinafter, for convenience, called also a "LS pattern image") is formed on the plate P. In the present specification, not limited to a pattern of which the duty ratio is 50% (the width of the line area is equal to that of space area), a pattern in which the line area and the space area are alternately repeated at a constant period is collectively called the line-and-space pattern.

Moreover, as an example, it is supposed that the pixel size (pixel pitch) is pg=30 nm and the number of laser pulses necessary to form the LS-pattern image on the plate P is 50. Further, the numerical aperture of the projection optical system PL is NA=0.85, and the LS-pattern image is formed under an illumination condition of the coherence factor σ=0.90 and the annular ratio Ann=⅔.

Next, descriptions are given for specific operations. As described above, since the display speed in the scanning direction of patterns generated by the variable molding mask VM is sufficiently faster than the speed of the stage ST, a description method in which as if formation of one pattern is performed on the plate P by a stationary exposure is employed below.

Figure 5:
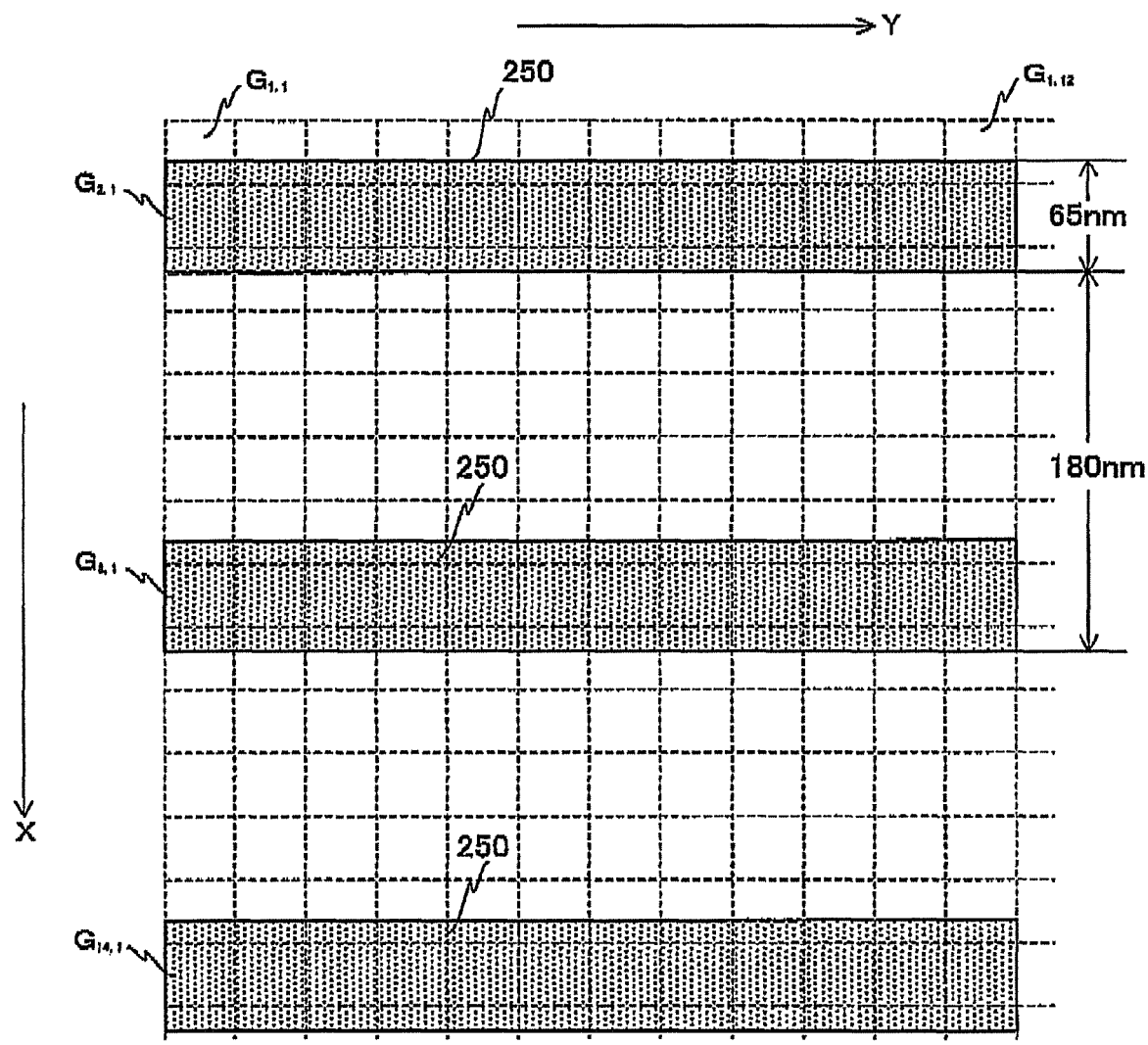
FIG. 5 is a view for explaining an example of the line-and-space pattern.

(1) First, the drive system 30, based on design data sent from the host device 50, computes the line width d, the length L, the pitch pp, and the position of each line pattern on the two-dimensional pixels (e.g., center position) or the like as target pattern information. Here, as shown in FIG. 5 as an example, it is supposed that each pixel is a four-square of 30 nm×30 nm, d=65 nm, L=360 nm, and pp=180 nm. Further, it is supposed that the position of the centerline of each line pattern matches the centerline of a pixel array at the center.

(2) Next, the drive system 30, based on the target pattern information, acquires overlay information of basic patterns corresponding to the target pattern from signal generation information stored in the memory 33 as information on the target pattern. Here, as the overlay information of the basic patterns according to the target pattern information (or design data of the target pattern) for which "d=65 nm, L=360 nm, pp-180 nm, and the position of the centerline of each line pattern matches the centerline of a pixel array at the center", a pattern combination for which a basic pattern 90CE is 34 pulses, a basic pattern 90LE is 8 pulses, and a basic pattern 90RI, is 8 pulses is acquired (see FIG. 6). Note that the memory 33 stores pattern combination information in which types of basic patterns suitable for formation of the target pattern and the number of pulses of each basic pattern are set in a table format, as a part of the signal generation information, by each target pattern information (or design data of the target pattern). This combination information (the overlay information of basic patterns) is previously computed in experiments, simulations, theoretical calculations, or the like to reduce a dimensional error and a positional error of patterns formed on the plate P smaller than each tolerance which is smaller than the pixel size of two-dimensional pixels virtually set on the plate P. Further, for this combination information, corrections (i.e., an optical proximity effect correction (OPC)) of both or either one of the line width error and the positional error of patterns due to an optical proximity effect (OPE) are taken into consideration. For a target pattern that does not require, e.g., OPC, the combination information described above may not include the correction information.

Meanwhile, as shown in FIG. 7, the basic pattern 90CE is a pattern in which a sequence of three Off-attitudes and a following sequence of four On-attitudes form a set, and the set is repeated from $m_{1,j}$ (j=1 to 12) as a start point. Further, the basic pattern 90LE is a pattern in which the basic pattern 90CE described above is shifted to the −mx side only by one micro mirror.

Further, the basic pattern 90RI is a pattern in which the basic pattern 90CE described above is shifted to the +mx side only by one micro mirror (see FIG. 7). Note that 90 of 90CE, 90LE, and 90RI means 90 nm at a converted value on the plate, and three off attitudes are sequent since 30 nm×3=90 nm.

As described above, in each basic pattern, distribution states of a light region (corresponds to the On attitude) and a dark region (corresponds to the Off attitude) are different each other. Note that in FIG. 7, the Off attitude (corresponds to the dark region) is indicated with "0" and the On attitude (corresponds to the light region) with "1".

(3) Next, the drive system 30 generates a signal that drives each micro mirror based on the acquired combination information (the overlay information of basic patterns), and supplies it to the driving mechanism of each micro mirror. Here, as an example, the system supplies a signal to drive each micro mirror at first 34 pulses such that the basic pattern 90CE is generated by the variable molding mask VM, supplies a signal to drive each micro mirror at next 8 pulses such that the basic pattern 90LE is generated by the variable molding mask VM, and a signal to drive each micro mirror at next 8 pulses such that the basic pattern 90RI is generated by the variable molding mask VM. Note that a generation order of each basic pattern is not limited to this order, and can be chosen to be any of orders in which the basic pattern 90CE is generated at 34 pulses of the 50 pulses, the basic pattern 90LE is generated at 8 pulses, and the basic pattern 90RI is generated at 8 pulses.

In other words, an LS pattern image has been conventionally formed by using one (1 type) pattern in the present embodiment. The LS-pattern image is formed by using a combination of a plurality of basic patterns with different distribution states of the light areas and the dark areas each other.

Under conditions similar to the present embodiment, as a result of a simulation performed by the inventors to form a target LS pattern image on the plate P according to the pattern combination described above of the basic pattern 90CE at 34 pulses, the basic pattern 90LE at B pulses and the basic pattern 90RI at B pulses, the line width error (Δ-CD) and the positional error (Δ-Pos) of a LS pattern image formed, as shown in FIG. 8 as an example. As shown in FIG. 8, the line width error (Δ-CD) is less than 0.2 nm, the positional error (Δ-Pos) is less than 0.4 nm t and it can be concluded that the errors are sufficiently small.

In other words, even if the line width d is not any of integer multiples of the pixel size pg, a high line width precision and a positional precision can be obtained.

Next, we describe overlay information of basic patterns (combination information) corresponding to the target pattern information (or design data of the target pattern) for d=65 nm and L-360 nm similar to the target pattern mentioned above and, e.g., the pitch pp not equal to 180 nm with FIG. 6 and FIG. 7. For the pitch pp=200 nm, the drive system 30 acquires a combination of basic patterns, the basic pattern 90RI at 8 pulses, a basic pattern 120LE at 13 pulses, and the basic pattern 120RI at 29 pulses. Here, as shown in FIG. 7, the basic pattern 120LE is a set of a sequence of four Off attitudes and a following sequence of three On attitudes, and a pattern in which On attitudes on the mx side of the sequence of Off attitudes in the basic pattern 90CE are replaced by Off attitudes. Further, the basic pattern 120RI is a set of a sequence of four Off attitudes and a following sequence of three On attitudes, and a pattern in which on attitudes on the +mx side of the sequence of Off attitudes in the basic pattern 90CE are replaced by Off attitudes.

Further, for the pitch pp=210 nm, the drive system 30 acquires a combination of basic patterns, i.e. the basic pattern 90CE at 44 pulses, a basic pattern 120LE at 3 pulses, and the basic pattern 120RI at 3 pulses.

For the pitch pp=240 nm, the drive system 30 acquires a combination of basic patterns, i.e. the basic pattern 90CE at 32 pulses, the basic pattern 90LE at 21 pulse, and the basic pattern 120RI at 8 pulses.

For the pitch pp=300 nm, the drive system 30 acquires a combination of basic patterns, i.e. the basic pattern 90CE at 21 pulses, the basic patterns 120LE at 11 pulses, the basic pattern 120RI at 11 pulses, and a basic pattern 150 CE at 7 pulses. Here, as shown in FIG. 7, the basic pattern 150CE is a pattern in which On attitudes on the −mx side and on attitudes on the +mx side of a sequence of Off attitudes in the basic pattern 90CE are replaced by Off attitudes.

For the pitch pp=450 nm, the drive system 30 acquires a combination of basic patterns, i.e. the basic pattern 90CE at 20 pulses, the basic pattern 120LE at 4 pulses, the basic pattern 120RI at 4 pulses, and the basic pattern 150CE at 22 pulses.

For the pitch pp=600 nm, the drive system 30 acquires a combination of basic patterns, i.e. the basic pattern 90CE at 2 pulses, the basic pattern 90LE at 2 pulses, the basic pattern 90RI at 2 pulses, the basic patterns 120LE at 16 pulses, the basic pattern 120RI at 16 pulses, and the basic pattern 150CE at 12 pulses.

Further, for an isolated line (isolated pattern) of the target pattern, the drive system 30 acquires a combination of basic patterns, i.e. the basic pattern 90CE at 27 pulses and the basic pattern 150CE at 23 pulses.

Even in these cases, as a result of simulations performed by the inventors, as shown in FIG. 8 as an example, the line width error (Δ-CD) of the LS pattern image formed on the plate P was less than 0.2 nm, and the positional error (Δ-Pos) of the image was less than 0.4 nm. Particularly, the result shows that the LS pattern image can be formed on the plate P with a good accuracy even when the pitch pp is not any of integer multiples of the pixel size pg such as for the pitch pp=200 nm.

Figure 9:
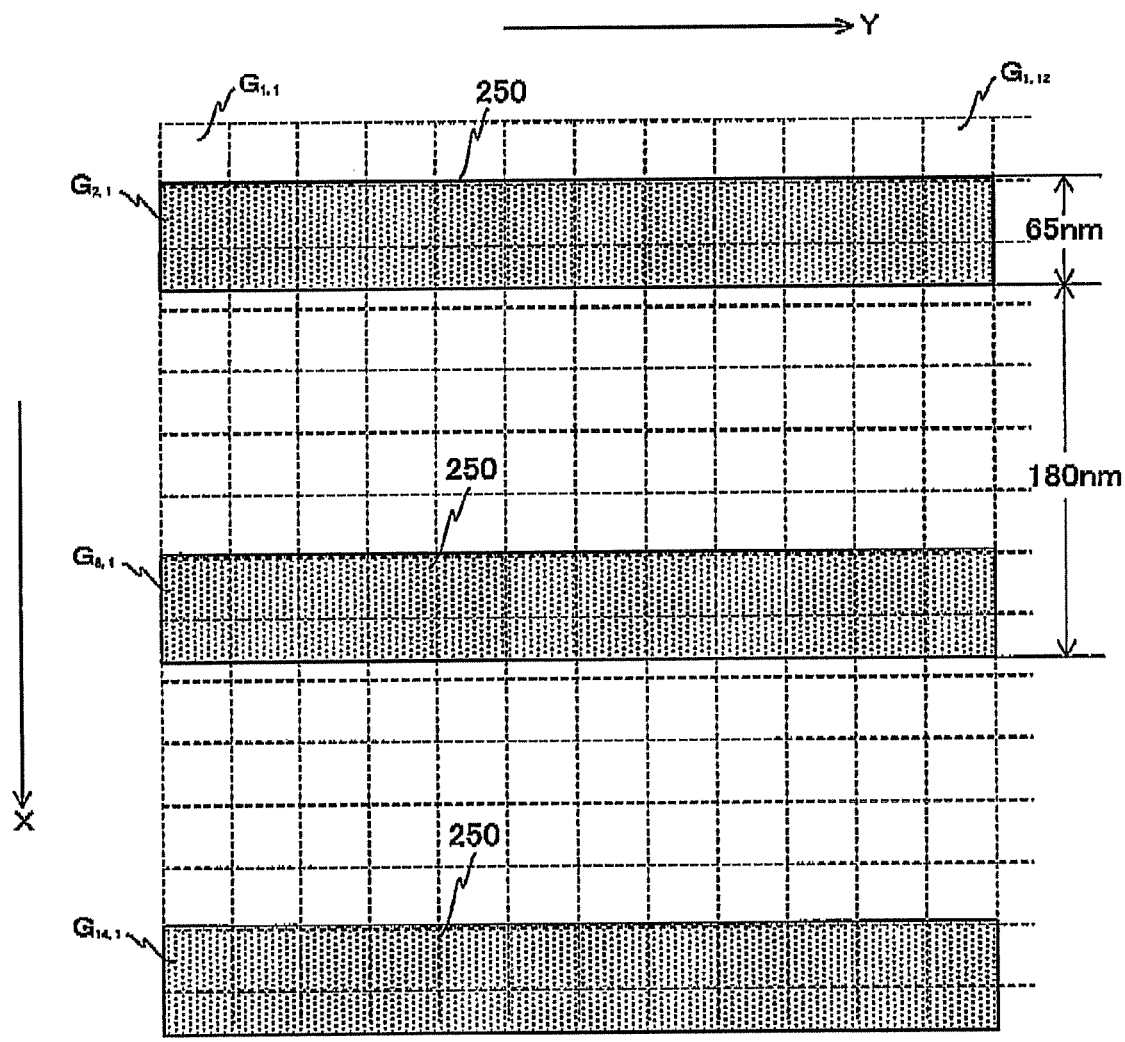
FIG. 9 is a view for explaining another example of the line-and-space pattern.

Meanwhile, in a case where the position of the centerline of each line pattern does not match the centerline of a pixel array at the center, combination information of basic patterns (overlay information) different from the combination information of basic patterns (overlay information) is used described above. For example, as shown in FIG. 9, in a case where the position of the centerline of each line pattern is shifted in the +X direction by 10 nm from the centerline of a pixel array at the center, combination information of basic patterns (overlay information), e.g., shown in FIG. 10 is used. For example, for the pitch pp=180 nm, the drive system 30 acquires a combination of basic patterns, i.e. the basic pattern 90CE at 29 pulses, the basic pattern 90LE at 19 pulses, and the basic pattern 90RI at 2 pulses.

Even in this case, as a result of simulations by the inventors, as shown in FIG. 11 as an example, the line width error (Δ-CD) of a pattern image formed on the plate P was less than 0.2 nm and the positional error (Δ-Pos) was less than 0.4 nm.

Further, for the pitch pp=200 nm, 210 nm, 240 nm, 300 nm, 450 nm, and 600 nm, combinations of basic patterns shown as FIG. 10 are acquired by the drive system 30.

In these cases, as a result of the simulation by the inventors, as shown in FIG. 11 as an example, the line width error (Δ-CD) of the pattern image formed on the plate P was less than 0.2 nm, and the positional error (Δ-Pos) was less than 0.4 nm.

Further, even if the position of the centerline of each line pattern is shifted in the −X direction from the center of a center pixel, by using a combination information of basic patterns (overlay information) corresponding to an amount of the shift, it is possible to form a target pattern on the plate P at the line width error (Δ-CD) suppressed to less than 0.2 nm and the positional error (Δ-Pos) suppressed to less than 0.4 nm.

As described above, according to the exposure apparatus 100 of the present embodiment the drive system 30, based on design data of patterns sent from the host device 50, computes target pattern information (the line width d, the length L, the pitch pp, and the position of each line pattern on two-dimensional pixels (e.g. center position) described above, or the like), and based on the target pattern information, acquires the overlay information of basic patterns according to the target pattern as information on the target pattern from signal generation information stored in the memory 33. Here, the overlay information of basic patterns is information including plural types of basic patterns with different distribution states of light areas and dark areas from each other and the number of pulses in pulsed lights by each type of basic patterns, which is previously computed for each target pattern in simulation or the like and stored in the memory 33. From the overlay information of a plurality of basic patterns stored in the memory, the drive system 30 acquires overlay information of basic patterns corresponding to the target pattern (optimum overlay information of basic patterns to form the target pattern with a good accuracy) as information on the target pattern.

Then, in actual exposures, the drive system 30 drives each micro mirror in the variable molding mask VM to either the On attitude or the Off attitude according to the overlay information acquired. Hence, a plurality of basic patterns are generated by the variable molding mask VM according to the number of pulses, and image-formed on the plate P via the projection optical system PL in an overlaid manner. According to the exposure apparatus 100 in the present embodiment, since a pattern according to design data is formed by overlying a plurality of basic patterns, it is possible to form a pattern with an arbitrary line width at arbitrary position on the plate P with a good accuracy at a resolving power (resolution) higher than a pixel size (pixel pitch). Further, as a result of simulation by the inventors, it has been confirmed that both of the line width error and the positional error of patterns formed is sufficiently small, in the exposure apparatus 100 of the present embodiment.

Further, according to the exposure apparatus 100 of the present embodiment, for a virtually dividing of an area on the plate P (illumination area) that can be exposed at once by the variable molding mask VM into a plurality of pixels, the size of the 1 pixel can be made larger to a certain extent. In other words, even if the total number of pixels is small, it is possible to form an arbitrary pattern at an arbitrary position on the plate P with a good accuracy. Therefore, it is possible to form a desired pattern on an object with a good accuracy without changing the number of micro mirrors controlled according to the dimensional accuracy and the positional accuracy required, and cost increase of the variable molding mask VM can be suppressed.

Further, according to the exposure apparatus 100 of the present embodiment, the drive system 30 drives each micro mirror in the variable molding mask VM to either the On attitude or the Off attitude. Thus, processing algorithms for the drive system 30 can be simplified, and higher speeds of processing can be achieved. Moreover, the cost increase of the drive system 30 can be suppressed.

Note that in the embodiment above, we considered some cases where the position of the centerline of each line pattern is shifted in the +X direction or the −x direction from the center of the center pixel array. However, even if the center of each line pattern is shifted in the +Y direction or the −Y direction from the center of the center pixel array, by using pattern combination information according to an amount of the shift, it can be realized that the line width error (Δ-CD) is less than 0.2 nm and the positional error (Δ-Pos) is less than 0.4 nm.

Further, in the embodiment above, the description was given for 50 laser pulses necessary in forming patterns according to design data, the present invention is not limited to this. For example, for 100 laser pulses, the number of pulses in pattern combination information should only be twice that of the first embodiment described above. Specifically, as overlay information corresponding to the target pattern information being "d=65 nm, L=360 nm, pp=180 nm, and the position of the centerline of each line pattern matches the centerline of a pixel array at the center", the pattern combination is a combination of the basic pattern 90CE at 68(=34×2) pulses, the basic pattern 90LE at 16(=8×2) pulses, and the On/Off pattern 90RI at 16(=8×2) pulses. Note that the total number of pulses of a plurality of basic patterns should only be more than a minimum of the number of pulses that is necessary in forming patterns.

Further, in the embodiment above, the description was given for a pixel size of 30 nm×30 nm, of course, but the invention is not limited.

Further, in the embodiment above, the description was given for forming a line-and-space pattern which is a type of a dense pattern on the plate P, the invention is not limited to this, but the present invention is suitable to form isolated patterns not mentioning dot patterns and other dense patterns.

Further, in the embodiment above, scanning exposure of the plate P is performed by scrolling patterns generated by the variable molding mask VM while scanning the plate P in the Y-axis direction for the projection optical system PL. Hence the exposure apparatus 100 may employ a step-and-stitch method (step-and-scan method) or a step-and-repeat method (step-and-scan method) in which the plate P is moved stepped in the X-axis direction after the scanning exposure ended, and patterns generated by the variable molding mask VM are scrolled while the plate P is scanned again in the Y-axis direction to perform scanning exposure to the plate P. In the step-and-stitch method, it is possible to form large area of patterns on the plate P, and in the step-and-repeat method, it is possible to form patterns, severally, in a plurality of partition areas (shot areas) on the plate P.

In the embodiment above, the width of the projection area of a pattern image created by the projection optical system PL is smaller than the width of one shot area on the plate P, with respect to the X-axis direction. Hence, to form a pattern on the entire surface of one shot area on the plate P, a reciprocal scanning in the Y-axis direction should be performed repeatedly while the plate P is stepped in the X-axis direction. Therefore, for example, regarding a plurality of shot areas arrayed in the Y-axis direction on the plate P as one large shot area, and a one-time scanning range of the plate P in the Y-axis direction may be set to a same level of the width of the large shot area. In other words, scanning exposure of a plurality of shot areas may be performed in one-time scanning. In this case, since the number of reciprocal scanning to the plate F can be reduced comparing to cases of performing scanning exposure by each shot area, throughput of the exposure apparatus can be improved.

Second Embodiment

Next, descriptions are given for the second embodiment of the present invention based on FIG. 12 to FIG. 15. Here, for constituent parts that are identical or equivalent to those in the first embodiment described above, the same marks are used, and their explanations are simplified or omitted.

Figure 12:
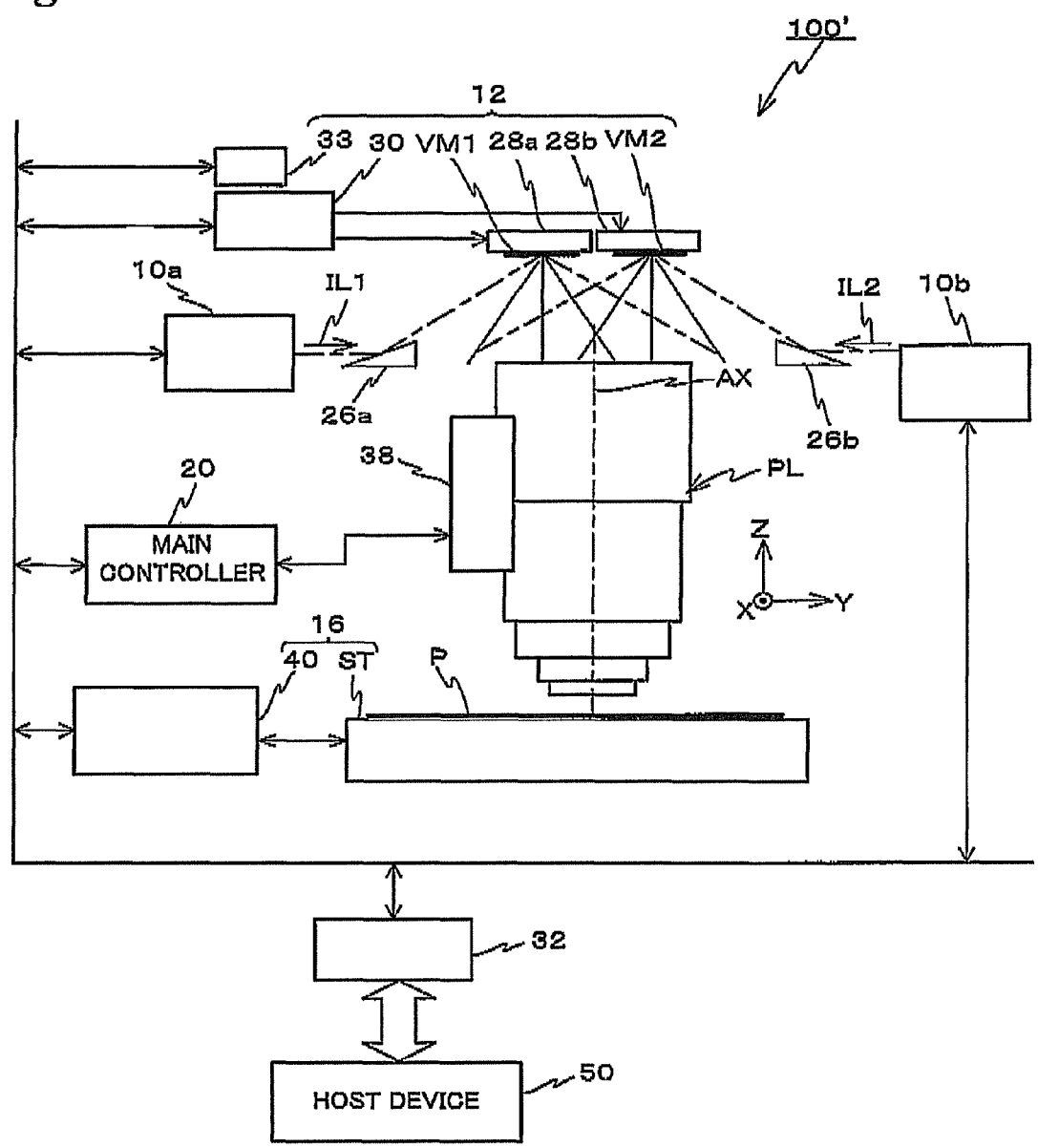
FIG. 12 is a view schematically showing a constitution of an exposure apparatus according to the second embodiment.

As shown in FIG. 12, the exposure apparatus 100' in the second embodiment is equipped with: two illumination systems (including the prisms 26a and 26b, respectively) 10a, 10b constituted similar to the illumination system 10 described above; two variable molding masks VM1, VM2 constituted similar to the variable molding mask VM described above illuminated, respectively, by illumination lights IL1, IL2 from the illumination systems 10a, 10b; and holders 28a, 28b that hold, respectively, the variable molding masks VM1, VM2. Although the prisms 26a, 26b, as described above, actually constitute a part of the illumination systems 10a, 10b, respectively, in FIG. 12 for convenience of explanation, they are shown by taking outside the illumination systems 10a, 10b. Hereinafter, it is supposed that the prisms 26a, 26b are outside the illumination systems 10a, 10b. The prisms 26a, 26b polarize, respectively, the illumination lights IL1, IL2 from the illumination systems 10a, 10b to allow them to be incident on the variable molding masks VM1, VM2. The constitution or the like of other parts are similar to the exposure apparatus 100 in the first embodiment described above. In the following, descriptions are given mainly for differences from the exposure apparatus 100 according to the first embodiment.

The exposure apparatus 100' in the second embodiment is suitable for simultaneously forming patterns of different types in different areas on the plate P.

Figure 13:
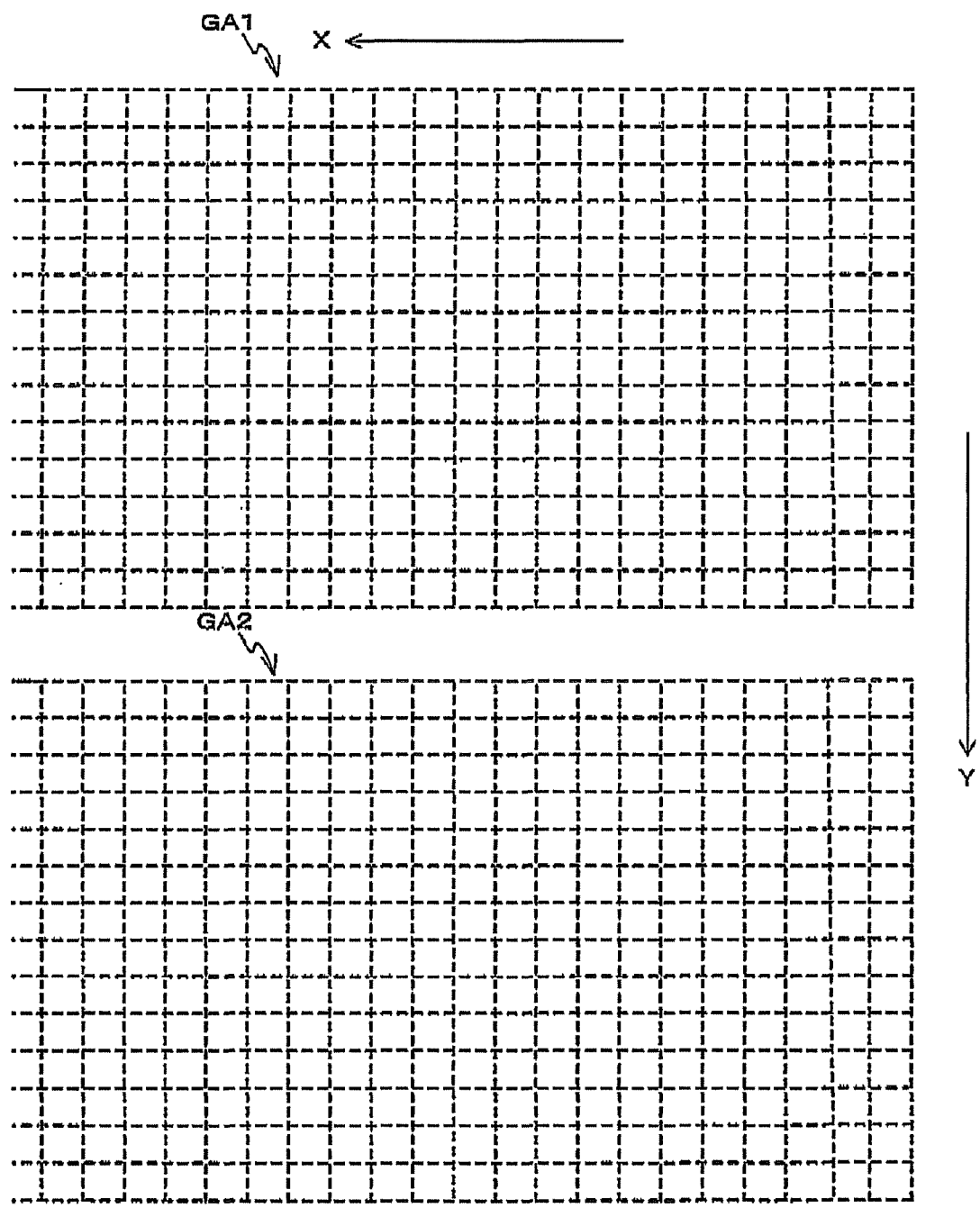
FIG. 13 is a view for explaining two-dimensional pixels virtually set on a plate.
Figure 14:
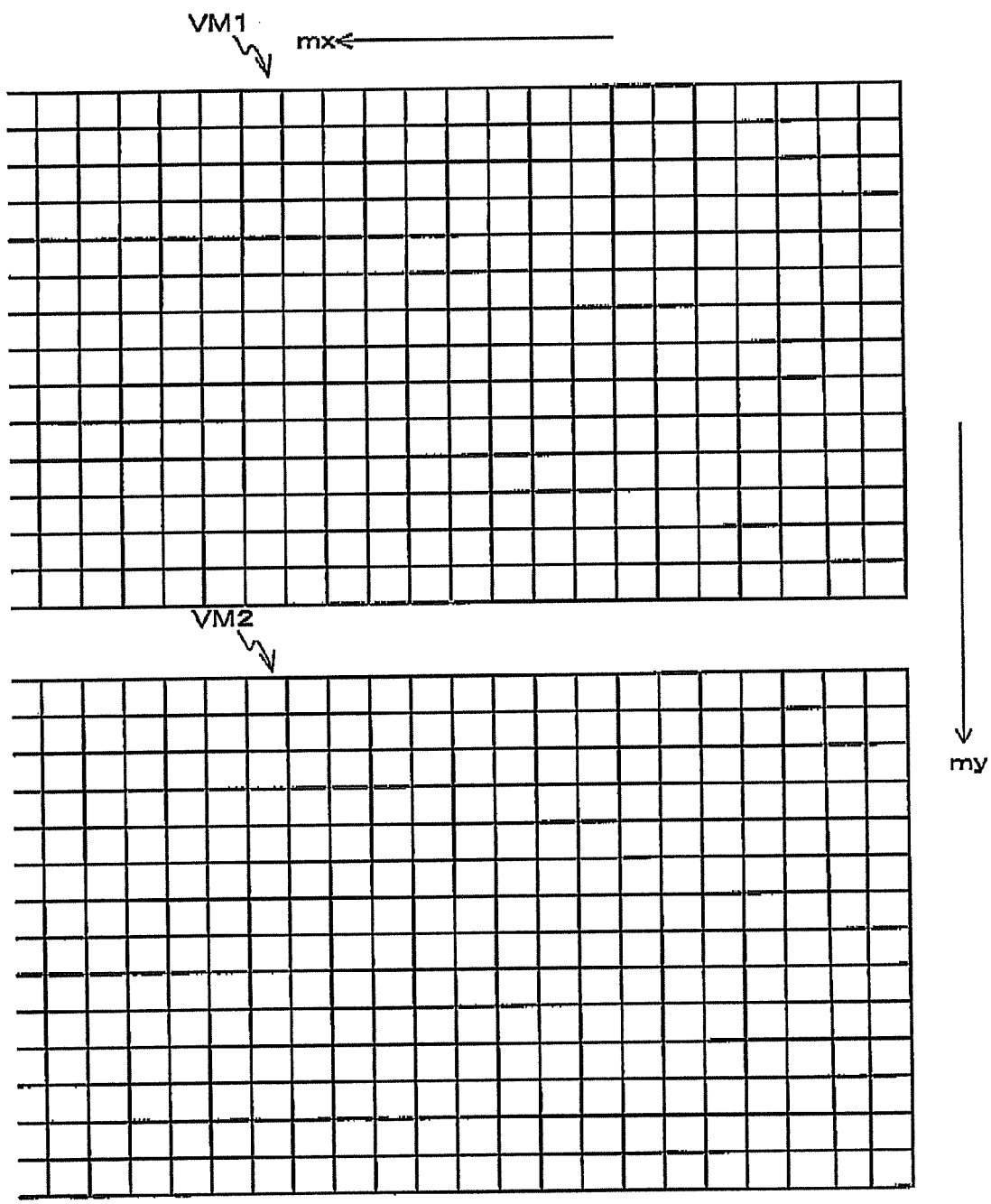
FIG. 14 is a view for explaining placement of the micro mirrors according to the second embodiment.

As shown in FIG. 13 as an example, it is supposed that virtual two-dimensional pixels GA1, GA2 are set in different areas on the plate P, and as shown in FIG. 14 as an example, the variable molding mask VM1 corresponds to the two-dimensional pixel GA1 and the variable molding mask VM2 corresponds to the two-dimensional pixel GA2. It is supposed that the pixel size of the two-dimensional pixels GA1, GA2 described above is 30 nm×30 nm, similarly to the first embodiment mentioned above. Actually, the two-dimensional pixels GA1, GA2 are virtually set on the plate P, respectively, corresponding to micro mirrors on the variable molding masks VM1, VM2. Here, for convenience of explanation, it is supposed that micro mirrors of the variable molding masks VM1, VM2 are virtually placed, respectively, corresponding to the two-dimensional pixels GA1, GA2.

Figure 15:
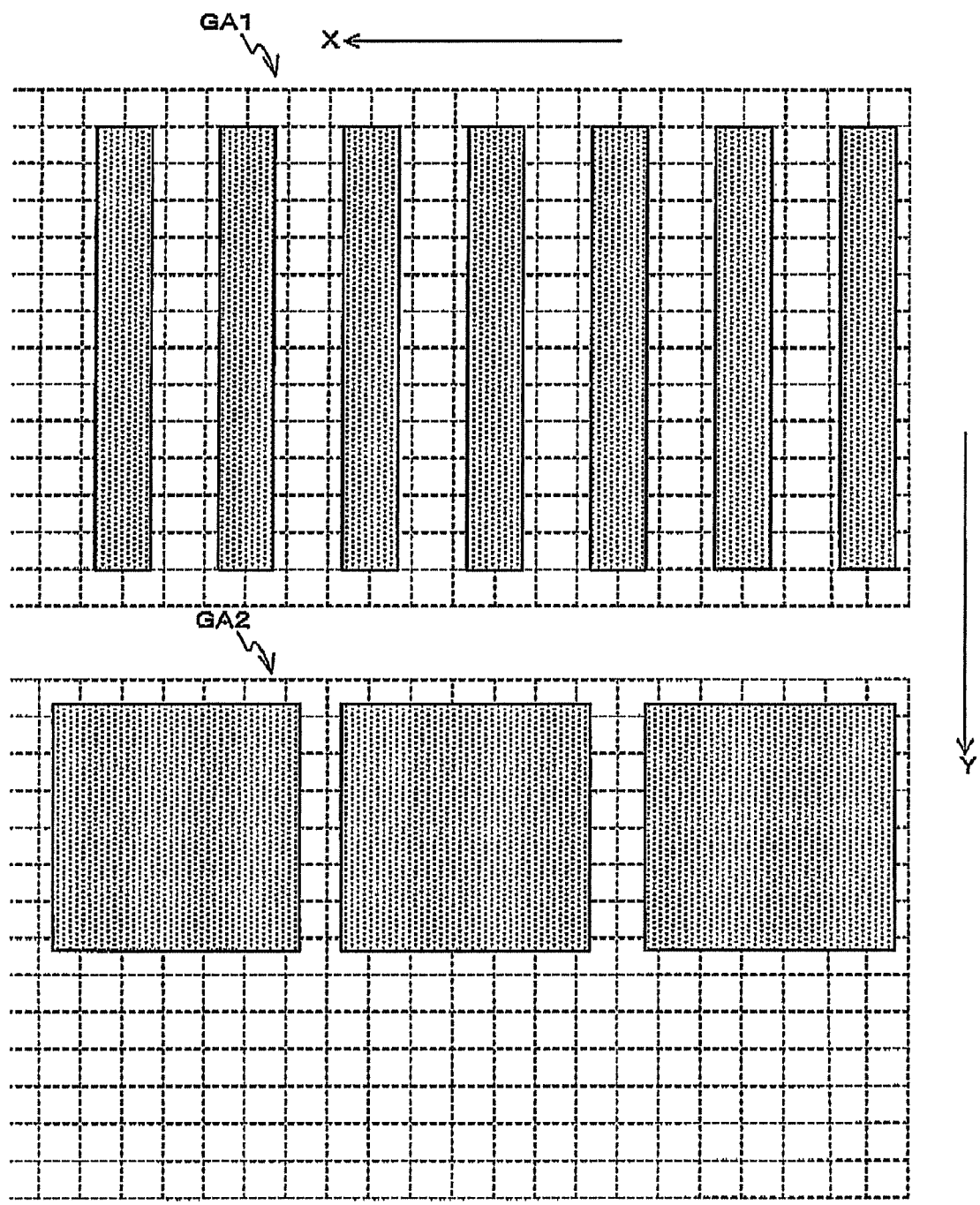
FIG. 15 is view for explaining an example of a pattern formed on a plate.
Figure 16:
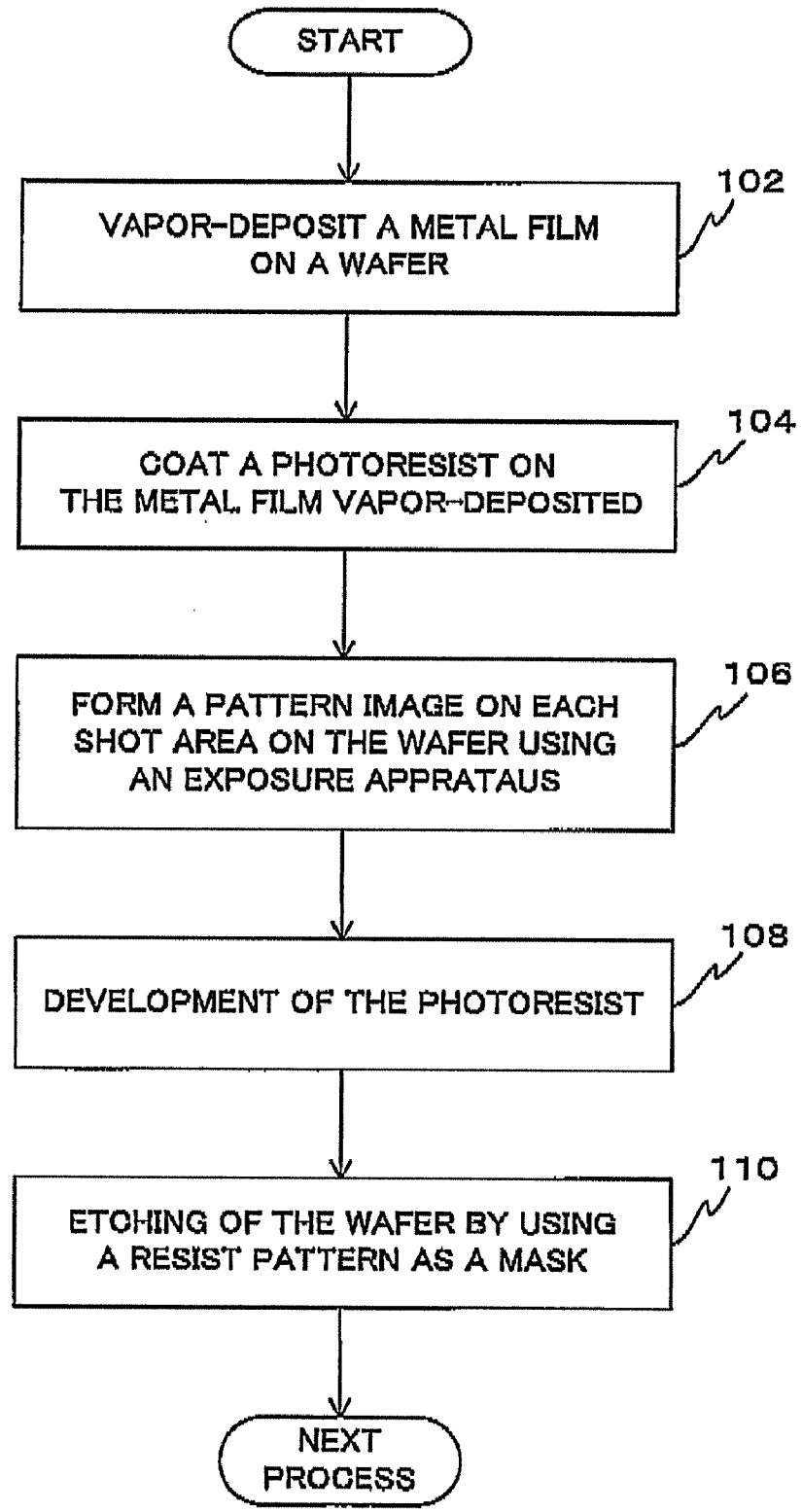
FIG. 16 is a flowchart for explaining a manufacturing method of semiconductor devices as a micro device.

Next, as shown in FIG. 15 as an example, we describe operations of the drive system 30 for forming a plurality of line patterns (hereinafter, for convenience, referred as "pattern A") in an area where the two-dimensional pixels GA1 are set and forming a plurality of rectangular patterns (hereinafter, for convenience, referred as "pattern B") in an area where the two-dimensional pixels GA2 are set. Here, it is supposed that the line width of both of the pattern A and the pattern B is not equal to any of integer multiples of the pixel size. In this case, similarly to the first embodiment described above, an explanation method that as if the formation of one pattern is performed on the plate P by stationary exposure is employed below.

(1) The drive system 30 computes the target pattern information of the pattern A and the target pattern information of the pattern B based on design data sent from the host device 50.

(2) Next, the drive system 30, similarly to the first embodiment, acquires optimum overlay information of basic patterns to form the pattern A (hereinafter, referred as "overlay information A"), and optimum overlay information of basic patterns to form the pattern B (hereinafter, referred as "overlay information B") as each information on target patterns from the signal generation information stored in the memory 33.

The overlay information is previously obtained from experiments, simulations, theoretical calculations, or the like to reduce the dimensional error and the positional error of each pattern formed on the plate P into the error range mentioned above. Further, the overlay information is information in which corrections of both or either one of the line width error and the positional error of patterns generated by an optical proximity effect (OPE) (i.e., the optical proximity effect correction (OPC)) is taken into consideration. For example, in a target pattern not require OPC, the overlay information may not include the correction information.

(3) The drive system 30, similarly to the first embodiment, generates a signal to drive each micro mirror of the variable molding mask VM1 (hereinafter, referred as "drive signal A") based on the overlay information A, and generates a signal to drive each micro mirror of the variable molding mask VM2 (hereinafter, referred as "drive signal B") based on the overlay information B. Then, the drive system 30 supplies the drive signal B to each driving mechanism of the variable molding mask VM2, while the drive signal A is supplied to each driving mechanism of the variable molding mask VM1.

Hence, a basic pattern generated by the variable molding mask VM1 is image-formed in an area on the plate P in which the two-dimensional pixels GA1 are set via the projection optical system PL. On the other hand, a basic pattern generated by the variable molding mask VM2 is image-formed in an area on the plate P in which the two-dimensional pixels GA2 are set via the projection optical system PL. However, in the second embodiment, as clear from FIG. 12, an image of the basic pattern is formed from two-beam interference between the 1st-order diffracted light and the 2nd-order diffracted light of the illumination light IL1 that are generated from the basic pattern generated by the variable molding mask VM1, and an image of the basic pattern is formed from a two-beam interference between the 1st-order diffracted light and the 2nd-order diffracted light of the illumination light IL2 that are generated from the basic pattern generated by the variable molding mask VM2.

As described, a plurality of basic patterns according to the overlay information A are generated according to the number of pulses, image-formed on the plate P via the projection optical system PL in an overlaid manner, the pattern A is consequently formed in the area on the plate P in which the two-dimensional pixels GA1 are set with a good accuracy, and a plurality of basic patterns according to the overlay information B are generated according to the number of pulses, image-formed on the plate P via the projection optical system PL in an overlaid manner, and the pattern B is consequently formed in the area on the plate P in which the two-dimensional pixels GA2 are set with a good accuracy.

Therefore, according to the exposure apparatus 100' in the second embodiment, effects which are equivalent to those in the first embodiment can be obtained in a simultaneous forming of patterns of different types in different areas on the plate P.

In the second embodiment described above, descriptions were given for the line width of the pattern A and the pattern B not equal to any of integer multiples of the pixel size of patterns. For a line width of either the pattern A or the pattern B, e.g., the pattern B is an integer multiple of the pixel size, the drive system 30 should only acquire the overlay information A described above as information on the target pattern as to the pattern A, control the On attitude and the Off attitude of each micro mirror of the variable molding mask VM1 based on the overlay information A with respect to the pattern A, and control the On attitude and the Off attitude of each micro mirror of the variable molding mask VM2 based on pattern information according to design data of patterns (information not overlay information) for the pattern B, similarly to conventional cases.

Thereby, the illumination light IL1 from the basic pattern generated by the variable molding mask VM1, based on the overlay information, is irradiated on an area where the two-dimensional pixels GA1 on the plate P are set, while the illumination light IL2 from the pattern generated by the variable molding mask VM1, based on the design information on the pattern B, is irradiated on an area where the two-dimensional pixels GA2 on the plate P are set, and consequently, plural types of patterns are, severally, formed on different areas on the plate P.

Note that, in the second embodiment described above, a pixel size on the two-dimensional pixel GA1 and a pixel size on the two-dimensional pixel GA2 may be identical to each other or different from each other.

Further, in the second embodiment described above, descriptions were given for a simultaneous forming of two types of patterns on the plate P by using the two variable molding masks VM1, VM2, but not limited to this, three or more variable molding masks may be arranged, and patterns of three types or more may be simultaneously formed on different areas on a sensitive object. Alternatively, by using a single variable molding mask, a plurality of modulation elements on the variable molding mask are divided into a plurality of groups of modulation elements, and different patterns may be formed in different areas on the sensitive object by the modulation element group of each group. Note that the identical patterns may be simultaneously formed in different areas on the plate by using a plurality of variable molding masks. In this case, the throughput can be improved in comparison with the first embodiment. Further, types of a plurality of patterns are not limited to the line-and-space pattern, but may be another dense pattern, isolated pattern, or the like.

Further, in the second embodiment described above, since a plurality of the variable molding masks VM1, VM2 are illuminated by using individually a plurality of the illumination lights IL1, IL2 from the illumination systems 10a, 10b, illumination conditions of the illumination systems 10a, 10b may be selected to be different according to types of target patterns. For example, in a case where a target pattern formed by using the variable molding mask VM1 is a dense pattern such as a line-and-space pattern, and a target pattern formed by using the variable molding mask VM2 is an isolated pattern such as an isolated line and a contact hole, a dipole illumination condition may be selected by using an illumination conditions setting mechanism for the illumination system 10a, and so-called small a illumination conditions may be selected by using the illumination conditions setting mechanism for the illumination system 10b. Additionally, a plurality of variable molding masks may be illuminated with illumination lights from a single illumination system.

Further, in the second embodiment described above, descriptions were given for a case where the projection optical system was one, for example, but a plurality of projection optical systems placed side by side in a non-scan direction (the X-axis direction) corresponding to a plurality of variable molding masks may be arranged. Further, even in the second embodiment, the step-and-stitch method (step-and-scan method) or the step-and-repeat method (step-and-scan method) mentioned above may be employed. Alternatively, as described above, a method in which the scanning exposure is performed to a plurality of shot areas arrayed in the identical direction on the plate P may be employed.

In the second embodiment described above, the same or different patterns were simultaneously formed in different areas on the plate P by using a plurality of variable molding masks, but a multiple exposure to form almost simultaneously or simultaneously different patterns in an identical area on the plate P by placing projection areas (equivalent to the two-dimensional pixels mentioned above) of pattern images of a plurality of variable molding masks in proximity or by overlaying at least a part of the areas with respect to the Y-axis direction on the image-plane side of the projection optical system PL can be performed.

Further, in the second embodiment described above, the two illumination systems 10a, 10b were, respectively, equipped with light sources, for example, but only one light source may be arranged, and illumination light from the light source may be split and guided to the two illumination systems. In a case where a scanning exposure of a plate with a plurality of variable molding masks is performed non-simultaneously, for example, by shifting slightly the start timing with illumination lights from a common light source, it is preferable to shift the generation timing of a pattern image of at least one of a plurality of variable molding masks.

In each of the embodiments above, the line width of patterns formed on the plate was a non-integer multiple of the pixel size, but the line width of a part of patterns may be an integer multiple of the pixel size. Further, for line-and-space patterns formed on a plate, for example, a pitch may be an integer multiple of the pixel size, a line width may be a non-integer multiple of the pixel size, vice versa. This is not limited to periodic patterns such as line-and-space patterns, but is applicable to other patterns including a plurality of pattern elements. Moreover, in each of the embodiments above, only the size or only the position of the plurality of basic patterns mentioned above may be different. Further, the number of pulses may be unified for in a part of or all of the plurality of basic patterns mentioned above.

Meanwhile, in each of the embodiments above, the illumination optical system was equipped with a field stop, for example, but an irradiation area of illumination light on: a plate may be practically defined with the On attitude and the Off attitude of each micro mirror of the variable molding mask.

Further, in each of the embodiments above, descriptions were given for a case of using a harmonic generator to generate harmonics (with a wavelength of 193 to 194 nm) of a single wavelength laser light oscillated from a single wavelength oscillation laser, as a light source, but not limited to this, a harmonic generator of a YAG laser may be used as long as the variable molding mask is illuminated by using illumination lights with a wavelength of, e.g., about 400 nm. Additionally, in a case where the repetition frequency of laser oscillation is not required so much, an ArF excimer laser or the like may be used.

Further, in each of the embodiments above, descriptions were given made for pulsed lights used as an illumination light, the present invention is not limited to this, but continuous lights may be used as an illumination light. In such a case, information which includes a plurality of basic patterns with different distribution states of light areas and dark areas from each other and irradiation time of illumination lights irradiated on the variable molding mask by each basic pattern should only be used as the overlay information according to the target pattern mentioned above. The point is that, regarding a target pattern with a size not equal to any of integer multiples of the size of two-dimensional pixels virtually set on an object (equivalent to the plate in the embodiments above) corresponding to placement of a plurality of modulation elements, overlay information according to target patterns, which includes information on a plurality of basic patterns with different distribution states of light areas and dark areas from each other and integrated light quantities of illumination lights irradiated on the variable molding mask by each basic pattern, may be used. Note that the overlay information does not necessarily include information of integrated light quantities.

In each of the embodiments above, descriptions were given act a case in which the variable molding mask including the DMD, being a nonemissive image display element, is used, instead of the DMD, a non-emissive image display element described below may be used. Here, the non-emissive image display element is called also a spatial light modulator (SLM), which is an element that spatially modulates amplitude (intensity), phase, or polarization of light traveling in a predetermined direction, and an electrochromic display (ECD) or the like is exemplified as a transmissive spatial light modulator, other than a transmissive liquid crystal display element (LCD). Further, as a reflective spatial light modulator, a reflective mirror array, a reflective liquid crystal display element, an electro phonetic display (EPD), an electronic paper (or electronic ink), a light diffraction type light valve (Grating Light Valve), or the like is exemplified other than the DMD described above. Further, in each of the embodiments above, instead of the variable molding mask equipped with the non-emissive image display element, a pattern generation device including a self-emissive image display element may be equipped. In this case, an illumination system is unnecessary.

Meanwhile, in a case of constituting the variable molding mask by using the reflective non-emissive image display element, a catadioptric system or a reflection system may be also used as a projection optical system other than the dioptric system mentioned above. Further, the variable molding mask including the transmissive non-emissive image display element may be used in a combination with projection optical systems of the catadioptric system, the reflection system, or the dioptric system. Further, an optical system equipped in the exposure apparatus of the present invention may be an equal-magnification system or an enlarging system, not limited to a reduction system.

Now, as disclosed, e.g., in International Publication No. 99/49504 pamphlet, European Unexamined Patent Application Publication) No. 1,420,298 specification, International Publication No. 2004/055803 pamphlet, Kokai (Japanese Unexamined Patent Application Publication) No. 2004-289126 (corresponding U.S. Pat. No. 6,952,253 specification) or the like, the present invention can be also applied to an exposure apparatus in which a liquid-immersion space including an optical path of illumination light is formed between the projection optical system and the plate and the plate is exposed with illumination lights via a projection optical system and liquid in the liquid-immersion space.

Further, as disclosed, e.g., in Kokai (Japanese Unexamined Patent Application Publication) No. 10-163099 and Kokai (Japanese Unexamined Patent Application Publication) No. 10-214783 (corresponding U.S. Pat. No. 6,590,634 specification), Published Japanese Translation of PCT application No. 2000-505958 (corresponding U.S. Pat. No. 5,969,441 specification), U.S. Pat. No. 6,208,407 specification, or the like, the present invention can be also applied to a multi-stage type exposure apparatus equipped with a plurality of stages.

Moreover, as disclosed, e.g., in Published Japanese translation of PCT application No. 2004-519850 and its corresponding U.S. Pat. No. 6,611,316 specification, or the like, the present invention can be also applied to an exposure apparatus in which patterns, severally, generated by a plurality of variable molding masks are synthesized on a plate via a projection optical system and a double exposure is performed to one area on the plate substantially simultaneously by one-time scanning exposure.

Note that the exposure apparatus of each of the embodiments above can be manufactured by installing an illumination optical system and a projection optical system, which are, severally, constituted of a plurality of optical elements, into a main body of an exposure apparatus and performing an optical adjustment, attaching the variable molding mask (pattern generation device) and a stage constructed from a large number of mechanical parts to the main body of the exposure apparatus and connecting wirings and piping, and furthermore performing total adjustment (electrical adjustment, operational check, or the like). It is desirable that the manufacturing of the exposure apparatus be performed in a clean room with temperature and cleanness or the like controlled.

Further, not limited to applications to manufacturing processes of semiconductor devices, the present invention can be widely applied, e.g., to manufacturing processes of display devices such as a liquid crystal display element and a plasma display, an imaging device (CCD or the like), a micro machine, an MEMS (Micro Electro Mechanical Systems), a thin film magnetic head that uses a ceramics wafer or the like as a substrate, and manufacturing processes of various devices such as a DNA chip. Moreover, the present invention can be also applied to manufacturing processes used to manufacture masks (photomask, reticle, or the like) on which mask patterns of various devices are formed, through a photolithography process.

Moreover, in the present invention, an object (plate) exposed is not limited to a glass plate and may be another object such as a wafer, a ceramic substrate, a film member and a mask blanks, and its shape is not limited to a circular shape and may also be a rectangular or the like.

As long as the national laws in designated (or elected) states to which this international application is applied permit, the disclosures cited in all of the Japanese Unexamined Patent Application Publications (including International Publication pamphlet) and the U.S. Patent Specifications with respect to the exposure apparatuses cited in each of the embodiments described above and modified examples are fully incorporated herein by reference.

Device Manufacturing Method

Next, descriptions are given for a manufacturing method of micro devices where the exposure apparatus in each of the embodiments above is used in the lithography process. FIG. 6 is a flowchart for explaining a manufacturing method of a semiconductor device as a micro device. Here, descriptions are given for a processing at a lot unit of wafers (plates).

First, in Step 102, metal films are vapor-deposited on wafers (plates) in the 1 lot. Next, in Step 104, a photoresist is coated on the metal films on the wafers (plates) in the 1 lots. After that, in Step 106, the exposure apparatus of each of the embodiments above projects sequentially images of patterns generated by the variable molding mask onto each shot area on the wafers (plates) in the 1 lot via the projection optical system PL according to information of a target pattern determined based on design data (including the overlay information mentioned above of basic patterns with respect to a target pattern with a size not any of integer multiples of the size of two-dimensional pixels virtually set on a plate corresponding to placement of a plurality of modulation elements).

After that, in Step 108, photoresists on the wafers (plates) in the 1 lot are developed, and in Step 110, etching is performed on the wafers (plates) in the 1 lot by using a resist pattern as a mask. Consequently, a circuit pattern corresponding to the design data is formed on each shot area on each wafer (plate).

After that, by performing a formation or the like of a circuit pattern of an upper layer, a device such as a semiconductor device is manufactured. Therefore, a pattern with a desired line width can be formed at a desired position with a good accuracy, and consequently, a device such as a semiconductor device can be manufactured with a good yield.

Figure 17:
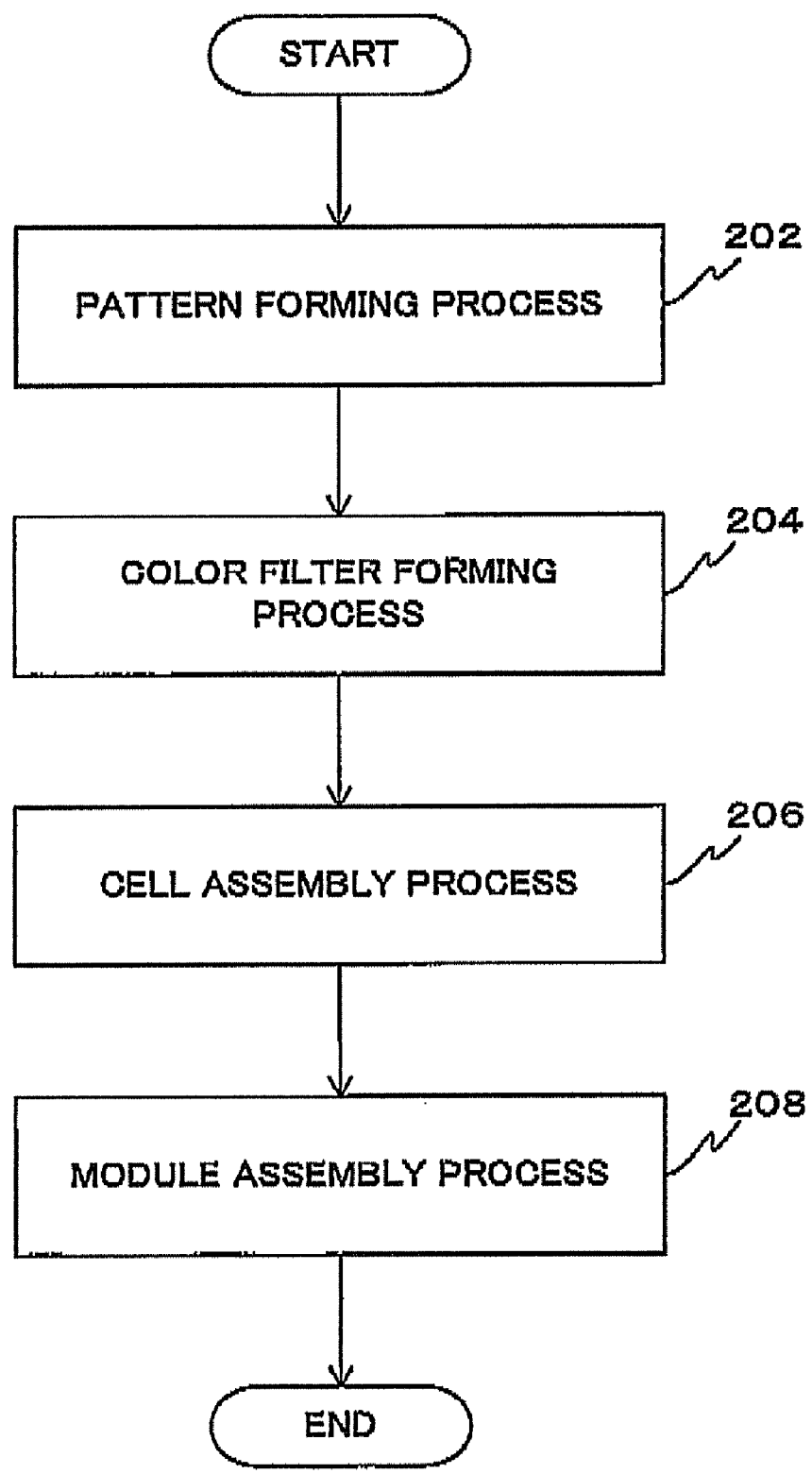
FIG. 17 is a flowchart for explaining a manufacturing method of liquid-crystal display elements as a micro device.

Further, in the exposure apparatuses according to the embodiments above, by forming a predetermined pattern (circuit pattern, electrode pattern, or the like) on the plate (glass substrate), a liquid crystal display element as a micro device can be also obtained. FIG. 17 is a flowchart for explaining a manufacture method of liquid crystal display elements as a micro device by forming predetermined patterns on the plate by using the exposure apparatus of each of the embodiments above.

In the pattern forming process of Step 202, the exposure apparatus of each of the embodiments above performs a so-called photolithography process in which images of patterns generated by the variable molding mask are sequentially formed on a sensitive substrate (glass substrate or the like coated with a resist) via the projection optical system PL, according to information on a target pattern determined based on design data (including overlay information of the basic pattern mentioned above of a target pattern with a size not equal to any of integer multiples of the size of two-dimensional pixels virtually set on a plate corresponding to placement of a plurality of modulation elements). In this photolithography process, predetermined patterns including a large number of electrodes or the like are formed on the sensitive substrate. After that, the substrate undergoes each process of a development process, an etching process, a resist peeling process, or the like, and predetermined patterns are formed on the exposed substrate.

Next, in a color filter forming process of Step 204, a color filter in which sets of three dots corresponding to R (Red), G (Green), and B (Blue) are arranged in large numbers in a shape of a matrix or plural sets of filters with three stripes of A, G and B are arranged in a horizontal scanning line direction is formed. Then, in a cell assembly process of Step 206 is performed after the color filter forming process (Step 204). In the cell assembly process of Step 206, a liquid crystal panel (liquid crystal cell) is assembled by using the substrate with a predetermined pattern obtained in the pattern forming process and the color filter obtained in the color filter forming process, or the like.

In the cell assembly process of Step 206, for example, liquid crystal is injected between the substrate having a predetermined pattern, which was obtained in the pattern forming process, and color filter obtained in the color filter forming process, and the liquid crystal panel (liquid crystal cell) is manufactured. After that, in a module assembly process of Step 208, components of an electrical circuit, a backlight or the like, which perform a display operation of the assembled liquid crystal panel (liquid crystal cell), are attached and completed as a liquid crystal display element.

As described above, in the pattern forming process of the manufacturing method of this micro device (liquid crystal display element), a pattern image with a desired line width can be formed at a desired position with a good accuracy, and consequently, the liquid crystal display element can be manufactured with a good yield.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A pattern formation method in which a pattern is formed on an object by using a variable molding mask and an optical system the variable molding mask having a plurality of modulation elements that are two-dimensionally placed at an incident position of an illumination light and that spatially individually modulate at least one of amplitude, phase and polarization states of the illumination light, and generating a pattern made up of light areas and dark areas, and the optical system forming an image of the pattern generated by the variable molding mask on the object, the method comprising:

acquiring information on a target pattern; and controlling the plurality of modulation elements of the variable molding mask such that at least one of the number and positions of a plurality of the modulation elements on the variable molding mask, which contribute to image-forming of a pattern by irradiating the illumination light, is changed while a plurality of basic patterns are overlaid on the object based on the information on the target pattern, and forming the target pattern in which the pattern has a line width of non-integer multiples of a size of an image of the modulation element at least partially on the object, by the overlaying of the plurality of basic patterns, wherein the plurality of basic patterns are each made up of light areas and dark areas, and the modulation elements corresponding to the light areas and the modulation elements corresponding to the dark areas are different from each other in at least one of a distribution and a placement on the variable molding mask.

2. The pattern formation method according to claim 1, wherein in the acquiring the information on the target pattern, with respect to a target pattern with a size not equal to any of integer multiples of a size of a two-dimensional pixel virtually set on the object corresponding to the plurality of modulation elements, overlay information of the plurality of basic patterns according to the target pattern, which includes information on plural basic patterns which are different from each other in at least one of a distribution and a placement of the light areas and the dark areas and information on integrated light quantity of the illumination light irradiated on the variable molding mask by each of the plural basic patterns, is acquired as the information on the target pattern, and in the controlling the plurality of modulation elements and the forming the target pattern, when a target pattern with a size not equal to any of integer multiples of a size of the two-dimensional pixel is formed on the object, the plurality of the modulation elements of the variable molding mask are controlled based on the overlay information.

3. The pattern formation method according to claim 2, wherein on forming plural types of target patterns at different positions on the object, in a case where all of the plural types of the target patterns are patterns with a size not equal to any of integer multiples of the two-dimensional pixel, the overlay information is acquired for each of the plural types of the target patterns in the acquiring the information on the target pattern, in the controlling the plurality of modulation elements and the forming the target pattern, an illumination light based on the overlay information for each of the plural types of the target patterns is irradiated in parallel at different positions on the object by using each of a plurality of modulation element groups each including a plurality of the modulation elements, and the plural types of the patterns are, severally, formed at different positions on the object.

4. The pattern formation method according to claim 3, wherein each of the plurality of modulation element groups is arranged on each of a plurality of variable molding masks.

5. The pattern formation method according to claim 2, wherein on forming plural types of patterns at different positions on the object, in a case where only some patterns of the plural types of the patterns are patterns with a size not equal to any of integer multiples of the two-dimensional pixel, the overlay information is acquired for the some patterns in the acquiring the information on the target pattern, and in the controlling the plurality of modulation elements and the forming the target pattern, an illumination light based on the overlay information for the some patterns is irradiated on a predetermined area on the object by using one group including a plurality of the modulation elements, and an illumination light based on design information on remaining patterns is irradiated on an area different from the predetermined area on the object by using another group including a plurality of the modulation elements to form the plural types of the patterns, severally, on different areas on the object.

6. The pattern formation method according to claim 5, wherein each of the groups of the modulation elements is arranged on each of a plurality of variable molding masks.

7. The pattern formation method according to claim 2, wherein the illumination light is a pulsed light, and the information on the integrated light quantity of the illumination light by each of the plural basic patterns includes the number of pulses.

8. The pattern formation method according to claim 2, wherein the overlay information is information for which corrections of at least one of a line width error and a positional error of the patterns due to an optical proximity effect, is taken into consideration.

9. The pattern formation method according to claim 2, wherein a pattern for which the overlay information is acquired is a dense pattern of which pattern pitch is an integer multiple of a size of the two-dimensional pixel.

10. The pattern formation method according to claim 9, wherein the dense pattern is a line-and-space pattern.

11. The pattern formation method according to claim 1, wherein image-forming of an image of the pattern on the object utilizes interference between a plurality of diffracted lights with different orders.

12. A device manufacturing method, comprising:

a process in which a pattern is formed on an object by using the pattern formation method according to claim 1; and a process in which the object on which the pattern was formed is developed.

13. The pattern formation method according to claim 1, wherein the information on the target pattern also includes information on integrated light quantity of the illumination light irradiated on the variable molding mask with respect to each of the plurality of basic patterns, and in the controlling the plurality of modulation elements and the forming the target pattern, when the pattern is formed, the plurality of modulation elements of the variable molding mask are controlled, further based on the information on the integrated light quantity.

14. The pattern formation method according to claim 1, wherein
the illumination light is a pulsed light, and
the information on the integrated light quantity of the illumination light with respect to each of the plurality of basic patterns includes the number of pulses.

15. An exposure method in which an object is exposed with an illumination light via a variable molding mask on which a plurality of modulation elements are placed two-dimensionally, the method comprising:
changing at least one of the number and positions of modulation elements on the variable molding mask which contribute to generation of a pattern, during the exposure, to overlay a plurality of basic patterns to form a pattern with a size of non-integer multiples of the modulation element at least partially on the object so that the pattern has an arbitrary line width at an arbitrary position on the object,
wherein in the plurality of basic patterns, the modulation elements contributing to the generation of the pattern and the modulation elements not contributing to the generation of the pattern are different from each other in at least one of a distribution and a placement on the variable molding mask.

16. The exposure method according to claim 15, wherein the pattern includes a line pattern with a line width of non-integer multiples of the modulation element.

17. The exposure method according to claim 15, wherein the pattern includes a dense pattern with a pitch of non-integer multiples of the modulation element.

18. The exposure method according to claim 15, wherein the pattern is formed by superposing a plurality of basic patterns which are generated by changing at least one of the number and positions of the modulation elements and of which at least one of size and position on the object is different.

19. The exposure method according to claim 15, wherein the pattern is generated on the object by utilizing interference between a plurality of diffracted lights with different orders, which are generated from the variable molding mask by irradiating the illumination light.

20. A device manufacturing method, comprising:
exposing an object by using the exposure method according to claim 15; and
developing the object exposed.

21. A pattern formation apparatus that forms a pattern on an object, the apparatus comprising:
an illumination system that emits an illumination light;
a variable molding mask with a plurality of modulation elements that are two-dimensionally placed at an incident position of the illumination light and spatially individually modulate at least one of amplitude, phase and polarization states of the illumination light, the variable molding mask generating a pattern made up of light areas and dark areas;
an optical system that forms an image of a pattern generated by the variable molding mask on the object; and
a controller that controls the plurality of modulation elements of the variable molding mask such that at least one of the number and positions of a plurality of the modulation elements on the variable molding mask, which contribute to image-forming of the pattern by irradiating the illumination light, is changed while plurality of basic patterns are overlaid on the object, based on information on the target pattern, and forms the target pattern in which the pattern has a line width of non-integer multiples of a size of an image of the modulation element at least partially on the object, by the overlaying of the plurality of basic patterns,
wherein the plurality of basic patterns are each made up of light areas and dark areas, and the modulation elements corresponding to the light areas and the modulation elements corresponding to the dark areas are different from each other in at least one of a distribution and a placement on the variable molding mask.

22. The pattern formation apparatus according to claim 21, further comprising:
an information acquiring device that acquires, with respect to a target pattern with a size not equal to any of integer multiples of a size of a two-dimensional pixel virtually set on the object corresponding to the plurality of modulation elements, overlay information of the plurality of basic patterns according to the target pattern, which includes information on plural basic patterns which are different from each other in at least one of a distribution and a placement of the light areas and the dark areas and information on integrated light quantity of the illumination light irradiated on the variable molding mask by each of the plural basic patterns as the information on the target pattern, wherein
the controller, on forming the target pattern with a size not equal to any of integer multiples of a size of the two-dimensional pixels on the object, controls the plurality of the modulation elements of the variable molding mask based on the overlay information.

23. The pattern formation apparatus according to claim 22, wherein
a plurality of the variable molding masks are placed side by side in a predetermined direction on a plane,
a plurality of the illumination systems are arranged corresponding to the plurality of the variable molding masks, respectively,
on forming plural types of patterns at different positions on the object, the acquiring device acquires the overlay information for each of the plural types of the target patterns in a case where all of the plural types of the patterns are patterns with a size not equal to any of integer multiples of a size of the two-dimensional pixel, and
the controller controls the plurality of the modulation elements of the plurality of the variable molding masks based on the overlay information for each of the plural types of the patterns.

24. The pattern formation apparatus according to claim 23, wherein
the controller makes illumination conditions of each of the plurality of the illumination systems different for each of the plurality of the illumination systems according to types of the target pattern.

25. The pattern formation apparatus according to claim 22, wherein
a plurality of the variable molding masks are placed side by side in a predetermined direction on a plane,
plurality of the illumination systems are arranged corresponding to the plurality of the variable molding masks, respectively
on forming plural types of patterns at different positions on the object, in a case where only some patterns of the plural types of the patterns are patterns with a size not equal to any of integer multiples of a size of the two-dimensional pixel, the acquiring device acquires the overlay information for the some patterns, and the controller controls the plurality of the modulation elements of the plurality of the variable molding masks based on the overlay information for the some patterns and design information for the remaining patterns.

26. The pattern formation apparatus according to claim 25, wherein
the controller makes illumination conditions of each of the plurality of the illumination systems different for each of the plurality of the illumination systems according to types of the target pattern.

27. The pattern formation apparatus according to claim 22, wherein
the illumination light is a pulsed light, and
the information on the integrated light quantity of the illumination light by each of the plural basic patterns includes the number of pulses.

28. The pattern formation apparatus according to claim 22, wherein
the overlay information is information for which correction of at least one of a line width error and a positional error of patterns due to an optical proximity effect is taken into consideration.

29. The pattern formation apparatus according to claim 22, wherein
the information acquiring device has a memory in which overlay information suitable for each design data is stored in a table format, and
the information acquiring device searches the table by using the design data as a key and acquires the overlay information.

30. The pattern formation apparatus according to claim 21, wherein
the variable molding mask is a reflective variable molding mask.

31. The pattern formation apparatus according to claim 30, wherein
the modulation element of the variable molding mask is a mirror element capable of varying an incident angle of a light according to a drive signal.

32. The pattern formation apparatus according to claim 31, wherein
the controller outputs a drive signal to vary the incident angle so as to allow a reflected light to go toward a direction of the optical system, with respect to mirror elements corresponding to the light areas, and outputs a drive signal to vary the incident angle so as to allow a reflected light to go toward a different direction from the direction of the optical system with respect to mirror elements corresponding to the dark areas.

33. The pattern formation apparatus according to claim 31, wherein
the variable molding mask includes a digital micro mirror device.

34. An exposure apparatus that exposes an object with an energy beam to form a predetermined pattern on the object, the apparatus comprising:
the pattern formation apparatus according to claim 21 as a formation device of the pattern.

35. A device manufacturing method, comprising:
a process in which an object is exposed by using the exposure apparatus according to claim 34 and a predetermined pattern is formed on the object; and
a process in which the object on which the pattern was formed is developed.

36. The pattern formation apparatus according to claim 21, wherein
the information on the target pattern also includes information on integrated light quantity of the illumination light irradiated on the variable molding mask with respect to each of the plurality of basic patterns, and
on forming the pattern, the controller controls the plurality of modulation elements of the variable molding mask further based on the information on the integrated light quantity.

37. The pattern formation apparatus according to claim 21, wherein
the illumination light is a pulsed light, and
the information on the integrated light quantity of the illumination light with respect to each of the plurality of basic patterns includes the number of pulses.

38. An exposure apparatus that exposes an object with an illumination light, the apparatus comprising:
a variable molding mask on which a plurality of modulation elements are placed two-dimensionally; and
a controller that changes at least one of the number and positions of modulation elements on the variable molding mask, which contribute to generation of a pattern, during the exposure, to overlay a plurality of basic patterns to form a pattern with a size of a non-integer multiple of the modulation elements on the object at least partially so that the pattern has an arbitrary line width at an arbitrary position on the object,
wherein in the plurality of basic patterns, the modulation elements contributing to the generation of the pattern and the modulation elements not contributing to the generation of the pattern are different from each other in at least one of a distribution and a placement on the variable molding mask.

39. The exposure apparatus according to claim 38, wherein
the pattern includes a line pattern with a line width of a non-integer multiple of the modulation element.

40. The exposure apparatus according to claim 38, wherein
the pattern includes a dense pattern with a pitch of a non-integer multiple of the modulation element.

41. The exposure apparatus according to claim 38, wherein
the pattern is formed by superposing a plurality of basic patterns which are generated by changing at least one of the number and positions of the modulation elements and of which at least one of size and position on the object is different.

42. The exposure apparatus according to claim 41, wherein
the illumination light is a pulsed light, and the number of pulses in each of the plurality of basic patterns, which is necessary to form the pattern, is determined.

43. The exposure apparatus according to claim 38, wherein
the apparatus generates the pattern on the object by utilizing interference between a plurality of diffracted lights with different orders, which are generated from the variable molding mask by irradiating the illumination light.

44. The exposure apparatus according to claim 38, wherein
the controller controls the variable molding mask to correct at least one of size and position of the pattern due to an optical proximity effect.

45. A device manufacturing method, comprising:
a process in which an object is exposed by using the exposure apparatus according to claim 38 and a predetermined pattern is formed on the object; and
a process in which the object on which the pattern was formed is developed.

* * * * *

UNITED STATES PATENT AND TRADEMARK OFFICE
CERTIFICATE OF CORRECTION

PATENT NO. : 8,405,816 B2
APPLICATION NO. : 12/330870
DATED : March 26, 2013
INVENTOR(S) : Shigeru Hirukawa et al.

Page 1 of 1

It is certified that error appears in the above-identified patent and that said Letters Patent is hereby corrected as shown below:

In the Claims:

Column 23, Line 65, In Claim 21, delete "while" and insert -- while a --, therefor.
Column 24, Line 59, In Claim 25, delete "plurality" and insert -- a plurality --, therefor.

Signed and Sealed this
Second Day of July, 2013

Teresa Stanek Rea
*Acting Director of the United States Patent and Trademark Office*